(12) United States Patent
Sun et al.

(10) Patent No.: US 8,481,392 B1
(45) Date of Patent: Jul. 9, 2013

(54) METHODS OF FABRICATING SEMICONDUCTOR DEVICE USING HIGH-K LAYER FOR SPACER ETCH STOP AND RELATED DEVICES

(75) Inventors: Min-Chul Sun, Seoul (KR); Byung-Gook Park, Seoul (KR)

(73) Assignees: Samsung Electronic Co., Ltd., Gyeonggi-do (KR); SNU R&DB Foundation, Seoul (KR)

( * ) Notice: Subject to any disclaimer, the term of this patent is extended or adjusted under 35 U.S.C. 154(b) by 0 days.

(21) Appl. No.: 13/542,717

(22) Filed: Jul. 6, 2012

(30) Foreign Application Priority Data

Dec. 30, 2011 (KR) ........................ 10-2011-0147035

(51) Int. Cl.
*H01L 21/336* (2006.01)
(52) U.S. Cl.
USPC ............................ 438/303; 438/299; 438/595
(58) Field of Classification Search
USPC ........................... 438/197, 199, 299, 303, 595
See application file for complete search history.

(56) References Cited

U.S. PATENT DOCUMENTS

| | | | |
|---|---|---|---|
| 5,573,965 A * | 11/1996 | Chen et al. | 438/297 |
| 6,130,135 A * | 10/2000 | Wu | 438/305 |
| 6,436,776 B2 * | 8/2002 | Nakayama et al. | 438/305 |
| 6,498,067 B1 * | 12/2002 | Perng et al. | 438/305 |
| 6,657,267 B1 | 12/2003 | Xiang et al. | |
| 7,112,497 B2 | 9/2006 | Mehrad et al. | |
| 7,235,491 B2 * | 6/2007 | Weng et al. | 438/704 |
| 7,456,062 B1 * | 11/2008 | En et al. | 438/231 |
| 2004/0113212 A1 * | 6/2004 | Lee et al. | 438/585 |
| 2005/0118769 A1 * | 6/2005 | Kammler et al. | 438/303 |
| 2006/0157750 A1 | 7/2006 | Kim et al. | |
| 2009/0020791 A1 * | 1/2009 | Yu et al. | 438/199 |
| 2010/0270622 A1 * | 10/2010 | Nandakumar et al. | 257/368 |
| 2011/0024805 A1 | 2/2011 | Kammler et al. | |

FOREIGN PATENT DOCUMENTS

JP 2006-324528 A 11/2006

\* cited by examiner

*Primary Examiner* — Kevin M Picardat
(74) *Attorney, Agent, or Firm* — Harness, Dickey & Pierce, P.L.C.

(57) ABSTRACT

Methods of fabricating a semiconductor device, and related devices, include forming a gate electrode on a substrate, forming a first buffer layer, a second buffer layer and a third buffer layer on side surfaces of the gate electrode and on the substrate near the gate electrode, forming a spacer covering the side surfaces of the gate electrode on the third buffer layer, the third buffer layer on the substrate being exposed, exposing the second buffer layer on the substrate by removing the exposed third buffer layer, exposing the first buffer layer on the substrate by removing the exposed second buffer layer, forming deep junction in the substrate using the spacer as a mask, and removing the spacer. The third buffer layer is a material layer having a higher dielectric constant than the second buffer layer. The spacer includes a material layer different than the third, second and first buffer layers.

20 Claims, 28 Drawing Sheets

METHODS OF FABRICATING SEMICONDUCTOR DEVICE USING HIGH-K LAYER FOR SPACER ETCH STOP AND RELATED DEVICES

CROSS-REFERENCE TO RELATED APPLICATION

This application claims priority under 35 U.S.C. §119 to Korean Patent Application No. 10-2011-0147035 filed on Dec. 30, 2011, the disclosure of which is hereby incorporated by reference in its entirety.

BACKGROUND

1. Field

Example embodiments relate to methods of fabricating a semiconductor device and related devices using a high-K layer as a spacer etch stop.

2. Description of Related Art

Various methods have been researched in which a spacer is formed on side surfaces of a gate electrode and a deep junction is formed.

SUMMARY

Example embodiments relate to methods of fabricating a semiconductor device and related devices using a high-K layer as a spacer etch stop.

Example embodiments provide methods of fabricating a semiconductor device and related devices capable of protecting the surface of a substrate while a spacer is formed.

The technical objectives are not limited to the above disclosure; other objectives may become apparent to those of ordinary skill in the art based on the following descriptions.

In accordance with example embodiments, a method of fabricating a semiconductor device is provided. The method may include forming a gate electrode on a substrate. A first buffer layer, a second buffer layer and a third buffer layer may sequentially be formed on side surfaces of the gate electrode and on the substrate near the gate electrode. The third buffer layer may be a material layer having a higher dielectric constant than the second buffer layer. A first spacer may be formed covering the side surfaces of the gate electrode on the third buffer layer. The third buffer layer on the substrate near the gate electrode may be exposed. The second buffer layer may be exposed on the substrate by removing the exposed third buffer layer. The first buffer layer may be exposed on the substrate by removing the exposed second buffer layer. A deep junction may be formed in the substrate using the first spacer as an ion implantation mask. The first spacer may be removed. The first buffer layer may remain over the deep junction when the first spacer is removed. The first spacer may include a material layer different than the third buffer layer, the second buffer layer, and the first buffer layer. In some example embodiments, the third buffer layer may be an insulating layer including a metal.

In example embodiments, the first buffer layer may include silicon oxide, the second buffer layer may include silicon nitride, and the first spacer may include one selected from poly-silicon, amorphous silicon and a combination thereof.

In example embodiments, the second buffer layer may include a material layer different than the third buffer layer. The third buffer layer may be thinner than the second buffer layer.

In example embodiments, the forming of the third buffer layer may include forming the second buffer layer over the first buffer layer, and doping metal elements in a surface of the second buffer layer.

In example embodiments, the removing of the exposed third buffer layer may include performing an isotropic etch process. The second buffer layer may remain over the first buffer layer when removing the exposed third buffer layer. An under-cut region may be formed between the first spacer and the second buffer layer.

In example embodiments, the removing of the exposed second buffer layer may include performing an isotropic etch process. The first buffer layer may remain over the substrate near the gate electrode when removing the exposed second buffer layer. The second buffer layer may be a material layer different from the first buffer layer. An under-cut region may be formed between the first spacer and the first buffer layer.

In example embodiments, the forming of the first spacer may include forming a first spacer layer on the third buffer layer, and anisotropically etching the first spacer layer until the third buffer layer is exposed. The first spacer layer may be about 3 to 10 times thicker than the third buffer layer.

In example embodiments, the substrate may be exposed by removing the exposed first buffer layer, after removing the first spacer. A metal silicide layer may be formed on the deep junction.

In example embodiments, a second spacer may be formed on the side surfaces of the gate electrode, prior to the forming of the first buffer layer. A shallow junction may be formed in the substrate near the gate electrode. The second spacer may be expanded between the first buffer layer and the substrate. The second spacer may include a material layer that is the same as the first buffer layer.

In accordance with example embodiments, a method of fabricating a semiconductor device is provided. The method may include forming a gate electrode on a substrate. An inner spacer may be formed covering side surfaces of the gate electrode and the substrate. A shallow junction may be formed in the substrate near the gate electrode. A buffer layer and an etch stop layer may sequentially be formed on the inner spacer. The etch stop layer may be an insulating layer having a plurality of metal elements. An outer spacer may be formed covering the side surfaces of the gate electrode on the etch stop layer. The etch stop layer may be exposed on the shallow junction. The buffer layer may be exposed on the shallow junction by removing the exposed etch stop layer. The inner spacer may be exposed on the shallow junction by removing the exposed buffer layer. A deep junction may be formed in the substrate using the outer spacer as an ion implantation mask. The outer spacer may be removed. The substrate may be exposed by removing the exposed inner spacer. A metal silicide layer may be formed on the deep junction. The outer spacer may include a material layer different than the etch stop layer, the buffer layer, and the inner spacer.

In accordance with example embodiments, a method of fabricating a semiconductor device is provided. The method includes forming a gate electrode on a substrate, forming a buffering layer structure along exposed surfaces of the gate electrode, wherein the buffering layer structure includes at least two buffer layers of which an outermost buffer layer has a dielectric constant higher than at least one inner buffer layer, forming a first spacer along side surfaces of the gate electrode and partially exposing the outermost buffer layer, wherein the first spacer includes a material layer different than that of the at least two buffer layers, repeatedly exposing the buffering layer structure to sequentially pattern the at least two buffer layers, forming a deep junction in the substrate using the first spacer as an ion implantation mask, and removing the first spacer.

Side surfaces of the deep junction may be spaced apart from the side surfaces of the gate electrode by a distance equal to a width of a patterned innermost buffer layer.

The method may further include forming a second spacer covering side surfaces of the gate electrode and the substrate, wherein the second spacer includes a material layer different than the material layer of the first spacer, and forming a shallow junction in the substrate prior to the forming of the buffering layer structure, wherein the shallow junction corresponds to the gate electrode.

The repeatedly exposing of the buffering layer structure may include exposing the at least one inner buffer layer over the shallow junction by removing the exposed outermost buffer layer, and exposing the second spacer over the shallow junction by removing the exposed at least one inner buffer layer.

An innermost buffer layer of the at least two buffer layers may remain over the deep junction when removing the first spacer.

BRIEF DESCRIPTION OF THE DRAWINGS

Example embodiments will be more clearly understood from the following detailed description taken in conjunction with the accompanying drawings.

FIGS. 1 and 29 are flowcharts illustrating a method of fabricating a semiconductor device in accordance with example embodiments;

FIGS. 2 to 28 and 30 to 48 are cross-sectional views illustrating processes explaining methods of fabricating of a semiconductor device in accordance with example embodiments; and FIGS. 49 and 50 are block diagrams illustrating a system for explaining electronic devices in accordance with application of example embodiments.

DETAILED DESCRIPTION OF THE EMBODIMENTS

Figure 1:
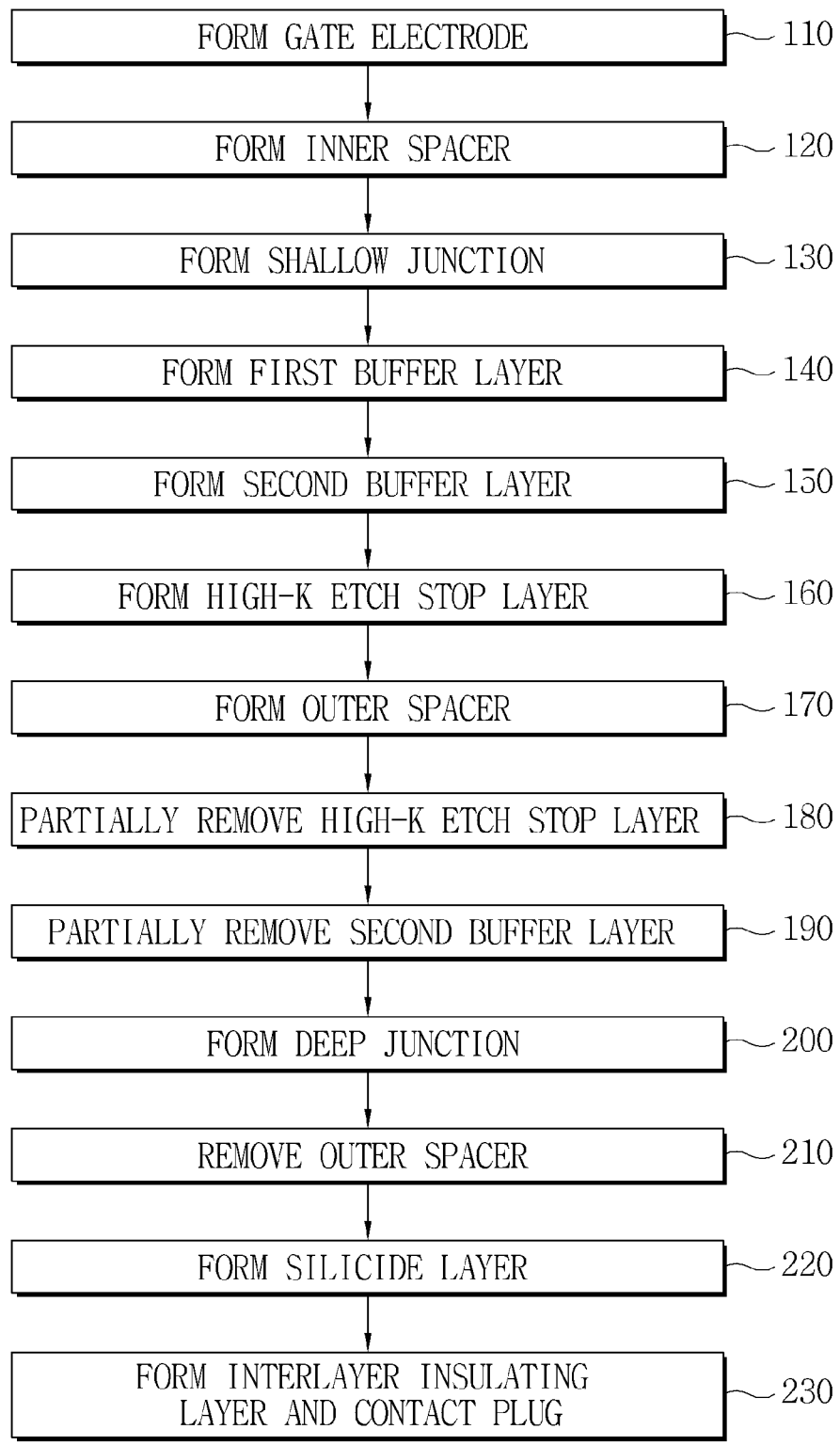
FIGS. 1-50 represent non-limiting, example embodiments as described herein.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to methods of fabricating a semiconductor device and related devices using a high-K layer as a spacer etch stop.

FIG. 1 is a flowchart illustrating a method of fabricating a semiconductor device in accordance with example embodiments. FIGS. 2 to 28 are cross-sectional views of processes explaining a method of fabricating of a semiconductor device in accordance with example embodiments.

Referring to FIG. 1, in accordance with example embodiments, a method of fabricating a semiconductor device may include forming a gate electrode (operation 110), forming an inner spacer (operation 120), forming a shallow junction (operation 130), forming a first buffer layer (operation 140), forming a second buffer layer (operation 150), forming an etch stop layer having a high-K material (operation 160), forming an outer spacer (operation 170), partially removing the etch stop layer (operation 180), partially removing the second buffer layer (operation 190), forming a deep junction (operation 200), removing the outer spacer (operation 210), forming a metal silicide layer (operation 220), and forming an interlayer insulating layer and a contact plug (operation 230).

In some example embodiments, the etch stop layer may be referred to as a third buffer layer. In other example embodiments, the inner spacer may be referred to as a first spacer, and the outer spacer may be referred to as a second spacer. In still other example embodiments, the inner spacer may be referred to as a second spacer, and the outer spacer may be referred to as a first spacer. Hereinafter, the example embodiments will be described in detail with reference to the drawings.

Figure 2:
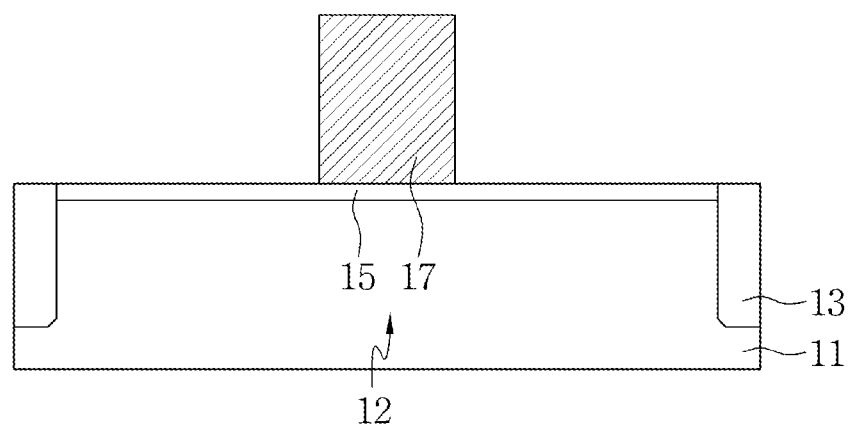

Referring to FIGS. 1 and 2, an element isolation layer 13 may be formed to define an active region 12 on a substrate 11. A gate dielectric layer 15 may be formed on the active region 12. A gate electrode 17 may be formed on the gate dielectric layer 15 (operation 110).

The substrate 11 may be a semiconductor substrate (e.g., a silicon wafer or a silicon on insulator (SOI)). The active region 12 may include P-type or N-type impurities. For example, the active region 12 may be a single crystalline semiconductor having P-type impurities. The element isolation layer 13 may be formed using shallow trench isolation (STI) technology. The element isolation layer 13 may include an insulation layer (e.g., silicon oxide, silicon nitride, silicon oxynitride, or a combination thereof).

The gate dielectric layer 15 may cover the active region 12. The gate dielectric layer 15 may include silicon oxide, silicon nitride, silicon oxynitride, a high-K material, or a combination of thereof. For example, the gate dielectric layer 15 may be silicon oxide. The gate electrode 17 may cross over the active region 12. The gate electrode 17 may be formed using a thin forming process and a patterning process. The gate electrode 17 may include a conductor (e.g., poly-silicon, a metal, metal silicide, metal nitride, or a combination thereof). For example, the gate electrode 17 may be a poly-silicon.

Figure 3:
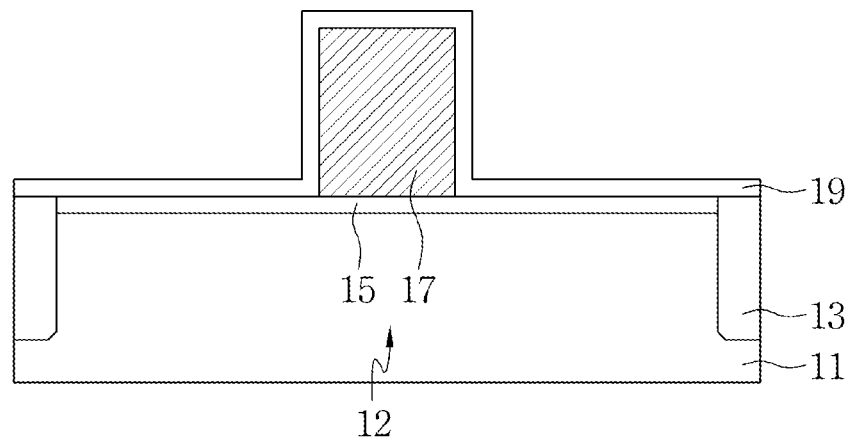

Referring to FIGS. 1 and 3, the inner spacer 19 may be formed to cover side surfaces of the gate electrode 17 (operation 120). An upper surface of the substrate 11 may be covered with the inner spacer 19 to a constant thickness. The inner spacer 19 may cover the side surface and the upper surface of the gate electrode 17, and may cover the gate dielectric layer 15. The gate dielectric layer 15 may be interposed between the inner spacer 19 and the active region 12. The inner spacer 19 may be L-shaped. The inner spacer 19 may include a silicon oxide, a silicon nitride, a silicon oxynitride, or a combination thereof. For example, the inner spacer 19 may be a silicon oxide (e.g., a medium temperature oxide (MTO)). The inner spacer 19 may be formed to have a thickness between about 5 nm and 15 nm. For example, the inner spacer 19 may be formed to have a thickness of approximately 10 nm.

Figure 4:
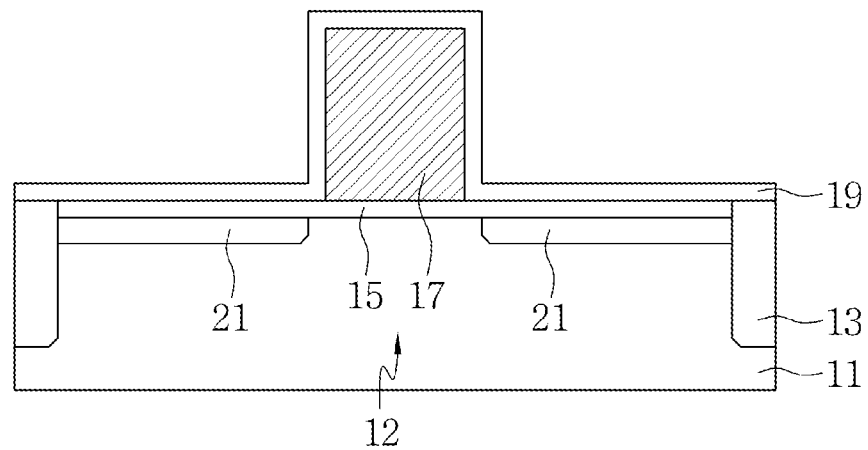

Referring to FIGS. 1 and 4, a shallow junction 21 may be formed by ion implanting impurities into the active region 12 near the gate electrode 17 using the inner spacer 19 as an ion implantation mask (operation 130). The shallow junction 21 may include conductive type impurities different from the active region 12. For example, the shallow junction 21 may include N-type impurities. The shallow junction 21 may be arranged outside the inner spacer 19.

Figure 5:
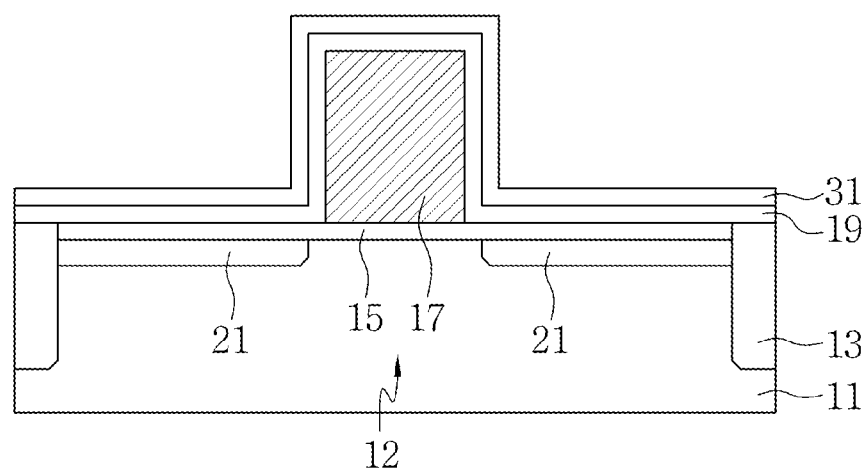

Referring to FIGS. 1 and 5, a first buffer layer 31 may be formed on the inner spacer 19 (operation 140). The first buffer layer 31 may include the same material as the inner spacer 19. For example, the first buffer layer 31 may be silicon oxide (e.g., medium temperature oxide (MTO)). The first buffer layer 31 may be formed to have a thickness between 5 nm and 15 nm. For example, the first buffer layer 31 may be formed to have a thickness of approximately 10 nm. The first buffer layer 31 may cover side surfaces of the gate electrode 17 and the shallow junction 21. The first buffer layer 31 may be L-shaped. The inner spacer 19 may be interposed between the first buffer layer 31 and the gate dielectric layer 15.

Figure 6:
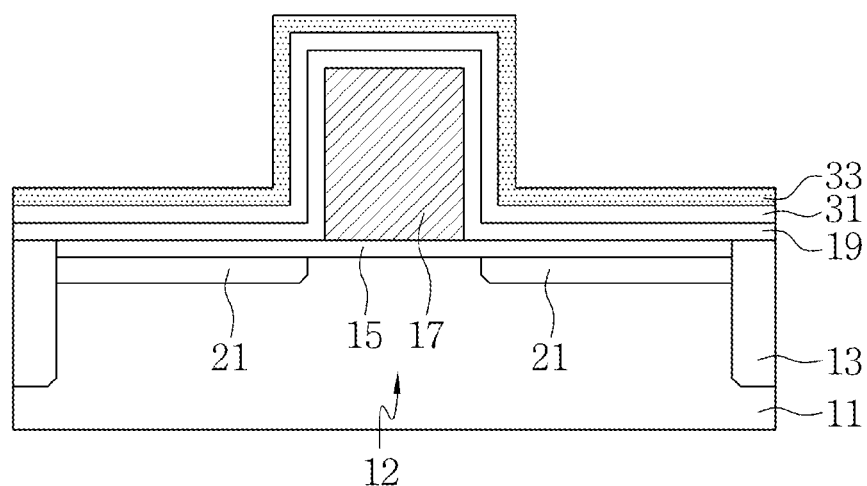

Referring to FIGS. 1 and 6, a second buffer layer 33 may be formed on the first buffer layer 31 (operation 150). The second buffer layer 33 may include a material layer having an etch selectivity with respect to the first buffer layer 31. The second buffer layer 33 may include a material different from the first buffer layer 31. For example, the first buffer layer 31 may be silicon oxide, and the second buffer layer 33 may be silicon nitride. The second buffer layer 33 may be formed to have a thickness between about 5 nm and 15 nm. The second buffer layer 33 may be thinner than the first buffer layer 31. For example, the second buffer layer 33 may be formed to have a thickness of approximately 7 nm. The second buffer layer 33 may cover side surfaces of the gate electrode 17 and the shallow junction 21. The second buffer layer 33 may be L-shaped. The first buffer layer 31 may be interposed between the second buffer layer 33 and the inner spacer 19.

Figure 7:
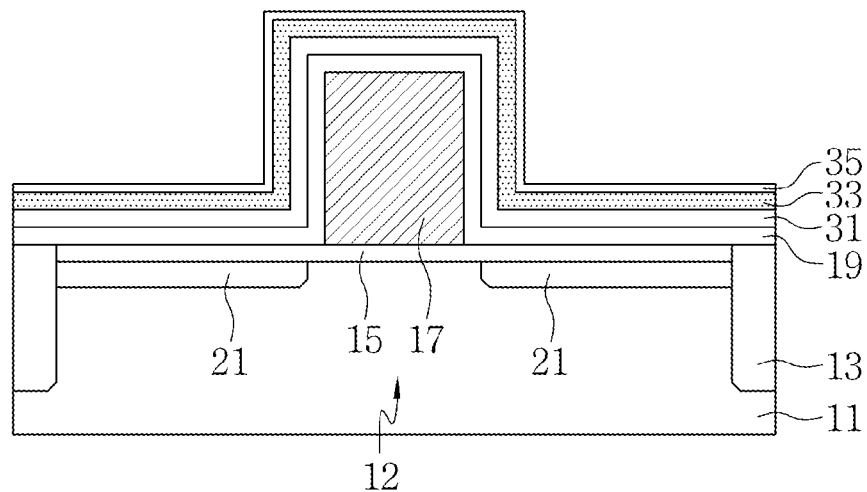

Referring to FIGS. 1 and 7, an etch stop layer 35 may be formed on the second buffer layer 33 (operation 160). The etch stop layer 35 may be referred to as a third buffer layer. The etch stop layer 35 may include a material layer having an etch selectivity with respect to the second buffer layer 33. The etch stop layer 35 may include a material different from the second buffer layer 33 and the first buffer layer 31. The etch stop layer 35 may include a high-K material. The etch stop layer 35 may be an insulating layer including metal elements. The etch stop layer 35 may be an insulating layer having a higher dielectric constant than the second buffer layer 33. The etch stop layer 35 may include AlO, AlSiO, (Ba,Sr) TiO, BaSrO, BeAlO, CeO, CeHfO, BiSiO, CoTiO/SiN, EuAlO, HfO, HfSiO, HfSiON, LaO, LaAlO, LaScO, LaSiO, MgAlO, NdAlO, PrAlO, SmAlO, SrTiO, PbTiO, BaTiO, TaO, TaO—TiO, TiO, TiO/SiN, WO, YO, YSiO, ZrO, PbZrO, PST (Pb-ScTaO), PZN (PbZnNbO), PZT (PbZrTiO), PMN (Pb-MgNbO), Zr—Al—O, ZrSiO, (Zr,Sn) TiO, or a combination thereof. For example, the etch stop layer 35 may include HfO or HfSiO.

The etch stop layer 35 may be formed to have a thickness between about 2 nm and 10 nm. The etch stop layer 35 may be thinner than the second buffer layer 33. For example, the etch stop layer 35 may be formed to have a thickness of approximately 5 nm. The etch stop layer 35 may cover side surfaces of the gate electrode 17 and the shallow junction 21. The etch stop layer 35 may be L-shaped. The second buffer layer 33 may be interposed between the etch stop layer 35 and the first buffer layer 31.

The etch stop layer 35 may be formed on the second buffer layer 33 using thin-film deposition technology (e.g., an atomic layer deposition (ALD) method, a physical vapor deposition (PVD) method, a chemical vapor deposition (CVD) method, and a combination thereof). In example embodiments, the etch stop layer 35 may be formed by doping metal elements in the surface of the second buffer layer 33. For example, the etch stop layer 35 may be formed by doping Hf, Zr, Ta or a combination thereof in the surface of the second buffer layer 33.

Figure 8:
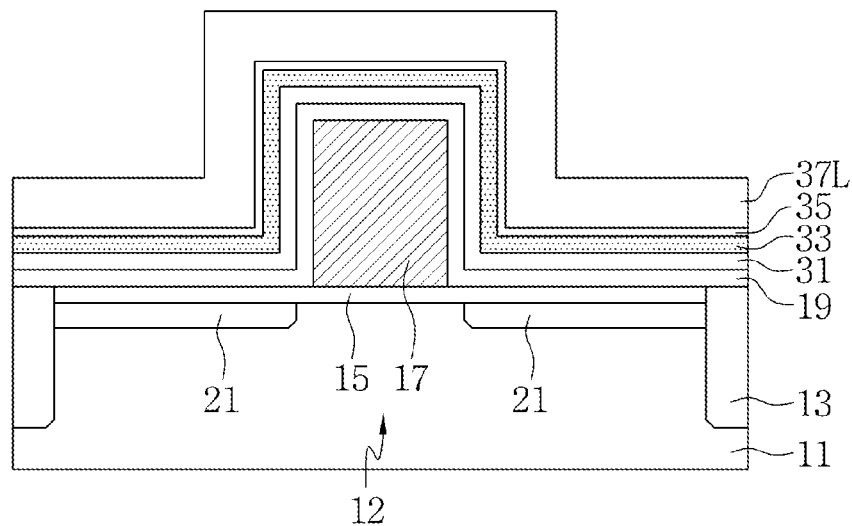

Referring to FIGS. 1 and 8, an outer spacer layer 37L may be formed on the etch stop layer 35. The outer spacer layer 37L may include a material layer having an etch selectivity with respect to the etch stop layer 35. The outer spacer layer 37L may include a material different from the etch stop layer 35, the second buffer layer 33, and the first buffer layer 31. The outer spacer layer 37L may include poly-silicon, amorphous silicon, or a combination thereof. The first buffer layer 31, the second buffer layer 33, the etch stop layer 35 and the outer spacer layer 37L may be material layers different from one another.

The outer spacer layer 37L may be formed to have a thickness between about 10 nm and 35 nm. The outer spacer layer 37L may be thicker than the etch stop layer 35. The outer spacer layer 37L may be 3 to 10 times thicker than the etch stop layer 35. For example, the outer spacer layer 37L may be formed to have a thickness of approximately 30 nm. The outer spacer layer 37L may cover side surfaces of the gate electrode 17 and the shallow junction 21. The outer spacer layer 37L may be L-shaped. The etch stop layer 35 may be interposed between the outer spacer layer 37L and the second buffer layer 33.

Figure 9:
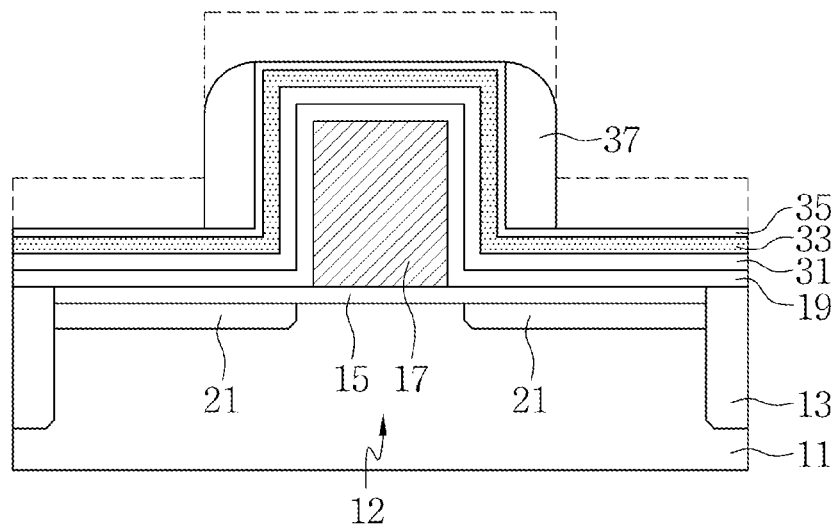

Referring to FIGS. 1 and 9, an outer spacer 37 may be formed by anisotropically etching the outer spacer layer 37L until the etch stop layer 35 is exposed (operation 170). The anisotropic etch of the outer spacer layer 37L may be performed using a reactive ion etching (RIE) process. For example, the anisotropic etch of the outer spacer layer 37L may be applied with inductively coupled plasma—reactive ion etching (ICP-RIE), or capacitively coupled plasma—reactive ion etching (CCP-RIE), technologies. The etch stop layer 35 may exhibit a high etch selectivity in the anisotropic etch process of the outer spacer layer 37L. The etch stop layer 35 may be preserved (or remain) on the second buffer layer 33 while forming the outer spacer 37. The etch stop layer 35 may be exposed on the upper portion of the shallow junction 21. The etch stop layer 35 may function to prevent the shallow junction 21 from being damaged while the outer spacer 37 is formed.

Experimental Example 1

In a case where the outer spacer layer 37L is silicon nitride, and the etch stop layer 35 is silicon oxide, the ICP-RIE method exhibits an etch selectivity of approximately 6:1.

Experimental Example 2

In a case where the outer spacer layer 37L is silicon nitride, and the etch stop layer 35 is silicon oxide, the CCP-RIE method exhibits an etch selectivity of approximately 1.7:1.

Experimental Example 3

As described in example embodiments, in a case where the outer spacer layer 37L is poly-silicon or amorphous silicon and the etch stop layer 35 is an insulating layer including metal elements, the ICP-RIE method relatively exhibits a much higher etch selectivity than experimental Example 1.

Experimental Example 4

In a case where the outer spacer layer 37L is poly-silicon or amorphous silicon and the etch stop layer 35 is an insulating layer including metal elements, the CCP-RIE method relatively exhibits a much higher etch selectivity than experimental Example 2. For example, in a case where the outer spacer layer 37L is silicon nitride and the etch stop layer 35 is HfO, it was revealed that both the ICP-RIE method and the CCP-RIE method exhibit an etch selectivity of approximately 10:1 or more.

In Experimental Examples 1 and 2, it may be understood that in the spacer formation technology using a combination of silicon nitride and silicon oxide, it is difficult to protect the surface of the semiconductor substrate and there is a limitation on size reduction of the semiconductor substrate. However, in Experimental Examples 3 and 4, it may be understood that in a case where the outer spacer layer 37L is poly-silicon or amorphous silicon and the etch stop layer 35 is an insulating layer including metal elements, the etch stop layer 35 is very favorable to prevent the shallow junction 21 from being damaged while the outer spacer 37 is formed, as described in example embodiments. In addition, even if the etch stop layer 35 has a very thin thickness, because the etch stop layer 35 can function to prevent the shallow junction 21 from being damaged, it may be understood that the configuration is favorable to reduce the size of the semiconductor device.

Figure 10:
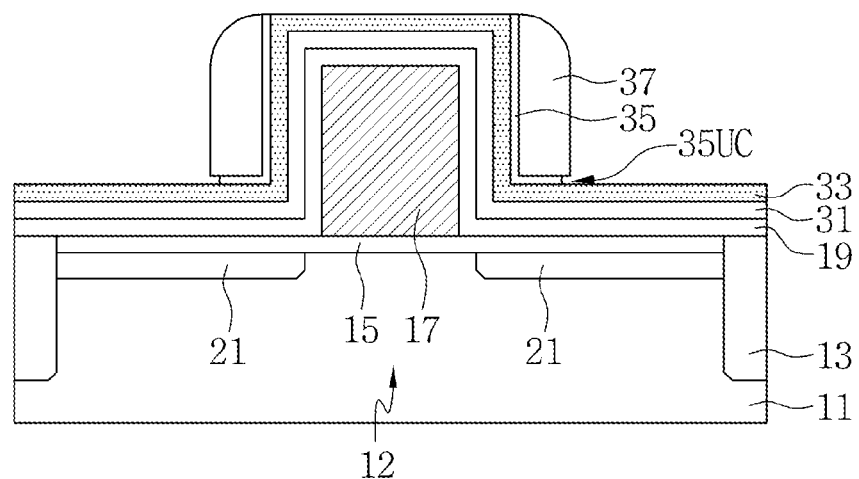

Referring to FIGS. 1 and 10, the second buffer layer 33 may be exposed by partially removing the etch stop layer 35 (operation 180). The removal of the etch stop layer 35 may be applied with an isotropic etching process. For example, the removal of the etch stop layer 35 may be applied with a cleaning process using a standard clean-1 (SC-1). In example embodiments, the removal of the etch stop layer 35 may be applied with a dry etching process using plasma. The second buffer layer 33 may be exposed on an upper portion of the gate electrode 17. In addition, the second buffer layer 33 may be exposed on an upper portion of the shallow junction 21. The second buffer layer 33 may exhibit a high etch selectivity with respect to the etch stop layer 35. The second buffer layer 33 may function to prevent the shallow junction 21 from being damaged while the etch stop layer 35 is removed.

The outer spacer 37 may exhibit a high etch selectivity with respect to the etch stop layer 35. The outer spacer 37 may be preserved (or remain) on side surfaces of the gate electrode 17. The etch stop layer 35 may be preserved (or remain) between the outer spacer 37 and the second buffer layer 33. A first undercut area 35UC may be formed between the outer spacer 37 and the second buffer layer 33. The first undercut area 35UC may be formed on a lower portion of the outer spacer 37.

Figure 11:
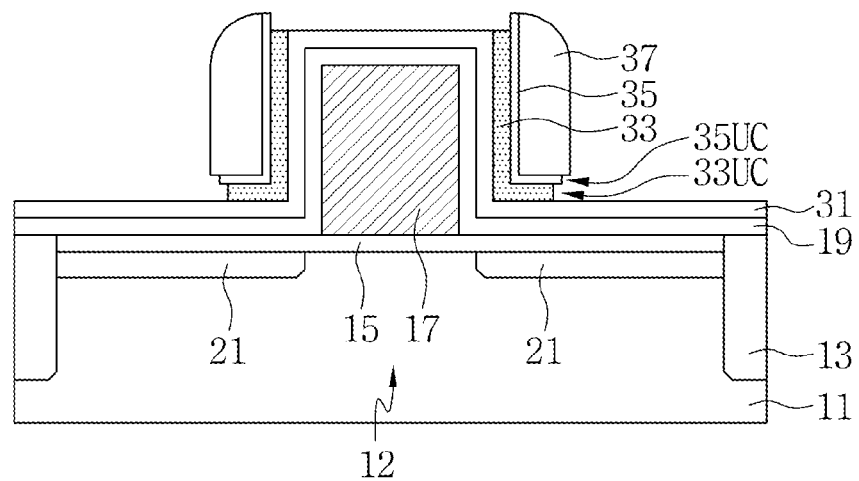

Referring to FIGS. 1 and 11, the first buffer layer 31 may be exposed by partially removing the second buffer layer 33 (operation 190). The removal of the second buffer layer 33 may be applied with an isotropic etching process. The first buffer layer 31 may be exposed on an upper portion of the gate electrode 17. In addition, the first buffer layer 31 may be exposed on an upper portion of the shallow junction 21. The first buffer layer 31 may exhibit a high etch selectivity with respect to the second buffer layer 33. The first buffer layer 31 may function to prevent the shallow junction 21 from being damaged while the second buffer layer 33 is removed.

The etch stop layer 35 and the outer spacer 37 may exhibit a high etch selectivity with regard to the second buffer layer 33. The etch stop layer 35 and the outer spacer 37 may be preserved (or remain) on side surfaces of the gate electrode 17. The second buffer layer 33 may be preserved (or remain) between the etch stop layer 35 and the first buffer layer 31. A second undercut area 33UC may be formed between the etch stop layer 35 and the first buffer layer 31. The second undercut area 33UC may be formed on a lower portion of the outer spacer 37.

Figure 12:
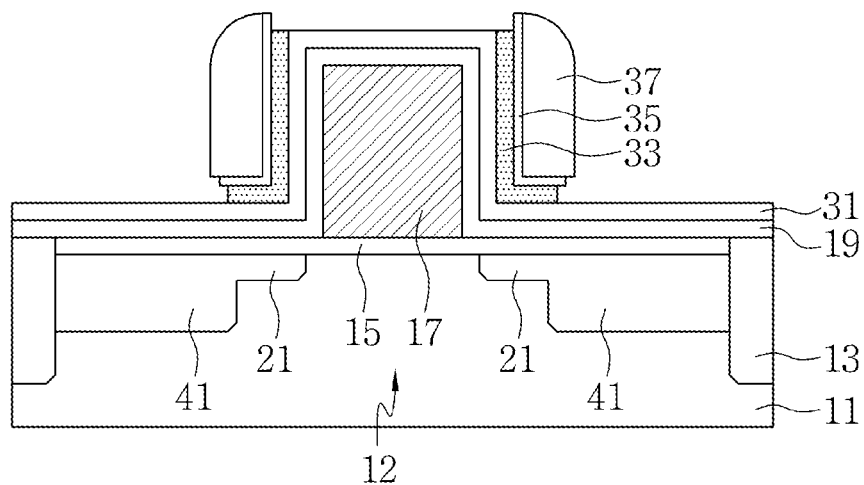

Referring to FIGS. 1 and 12, a deep junction 41 may be formed by ion-implanting impurities into the active region 12 using the outer spacer 37 as an ion implantation mask (operation 200). The deep junction 41 may include conductive type impurities different from the active region 12. The deep junction 41 may include the same conductive type impurities as the shallow junction 21. For example, the deep junction 41 may include N-type impurities. The deep junction 41 may be aligned with an outer side of the outer spacer 37. The gate dielectric layer 15, the inner spacer 19 and the first buffer layer 31 may be preserved (remain) on the shallow junction 21 while forming the deep function 41.

Figure 13:
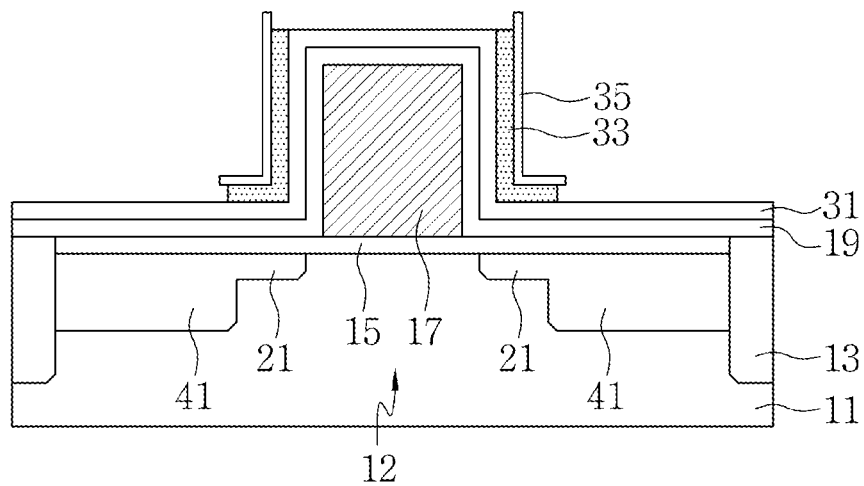

Referring to FIGS. 1 and 13, the etch stop layer 35 may be exposed by removing the outer spacer 37 (operation 210). The removal of the outer spacer 37 may be applied with an isotropic etching process. The first buffer layer 31 may exhibit a high etch selectivity with respect to the outer spacer 37. The first buffer layer 31 may be preserved (or remain) on the shallow junction 21 and the deep junction 41 while removing the outer spacer 37. The first buffer layer 31 may function to prevent the shallow junction 21 and the deep junction 41 from being damaged while the outer spacer 37 is removed.

Figure 14:
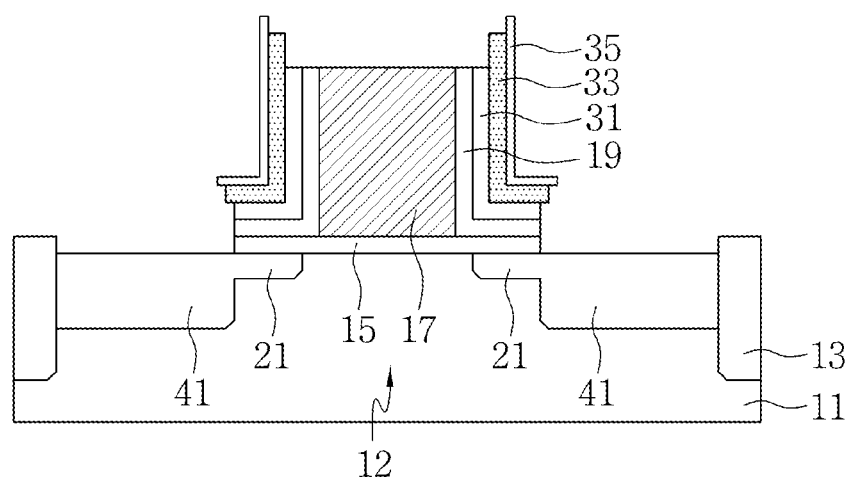

Referring to FIGS. 1 and 14, upper surfaces of the gate electrode 17 and the deep junction 41 may be exposed by partially removing the first buffer layer 31, the inner spacer 19 and the gate dielectric layer 15. The removal of the first buffer layer 31, the inner spacer 19 and the gate dielectric layer 15 may be applied with an isotropic etching process. The etch stop layer 35 and the second buffer layer 33 may exhibit a high etch selectivity with regard to the first buffer layer 31, the inner spacer 19 and the gate dielectric layer 15. The first buffer layer 31 and the inner spacer 19 may be preserved (or remain) between the second buffer layer 33 and the gate electrode 17. The gate dielectric layer 15 may be preserved (or remain) between the gate electrode 17 and the active region 12. The etch stop layer 35 may function to prevent a side surface of the gate electrode 17 from being exposed or damaged while the first buffer layer 31, the inner spacer 19 and the gate dielectric layer 15 are removed.

Figure 15:
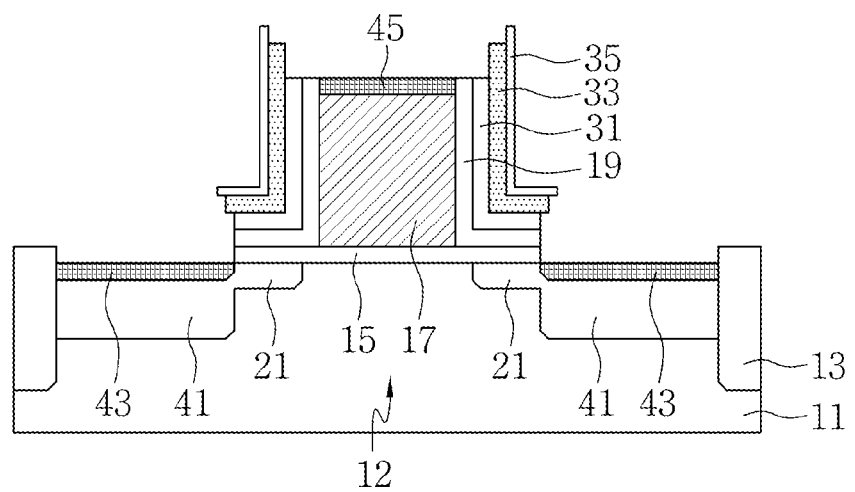

Referring to FIGS. 1 and 15, metal silicide layers 43 and 45 may be formed on upper surfaces of the gate electrode 17 and the deep junction 41 (operation 220). The metal silicide layers 43 and 45 may include a first metal silicide layer 43 formed on the deep junction 41, and a second metal silicide layer 45 formed on the gate electrode 17. The metal silicide layers 43 and 45 may include CoSi, NiSi, TiSi, TaSi, WSi, or a combination thereof.

Figure 16:
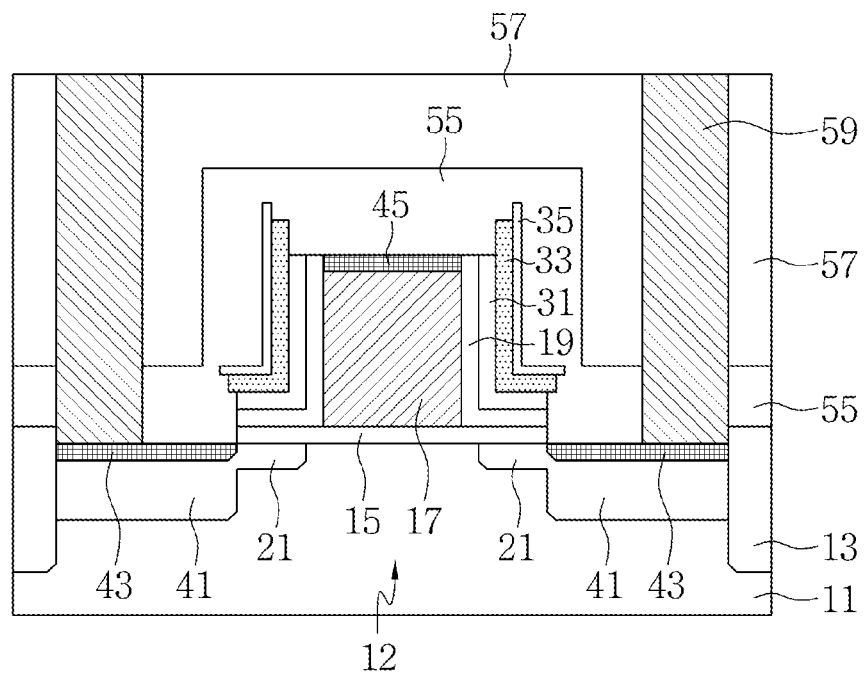

Referring to FIGS. 1 and 16, an intermediate etch stop layer 55 and an interlayer insulating layer 57 may sequentially be formed on the substrate 11 having the metal silicide layers 43 and 45. A contact plug 59 may be formed which passes through the interlayer insulating layer 57 and the intermediate etch stop layer 55. The intermediate etch stop layer 55 may include nitride (e.g., silicon nitride). The interlayer insulating layer 57 may include oxide (e.g., silicon oxide). The contact plug 59 may include poly-silicon, a metal, metal silicide, metal nitride, or a combination thereof.

As described above, in accordance with example embodiments, the outer spacer 37, the first buffer layer 31, the second buffer layer 33 and the etch stop layer 35 may include material layers different from one another. The etch stop layer 35 may exhibit a high etch selectivity in the process of forming the outer spacer 37. The second buffer layer 33 may exhibit a very high etch selectivity in the process of partially removing the etch stop layer 35. The first buffer layer 31 may exhibit a very high etch selectivity in the process of partially removing the second buffer layer 33. The first buffer layer 31 may be preserved (or remain) on the shallow junction 21 and the deep junction 41 while the deep junction 41 is formed using the outer spacer 37. The first buffer layer 31 may be preserved (or remain) on the shallow junction 21 and the deep junction 41 while the outer spacer 37 is completely removed. The metal silicide layer 43 may formed on the deep junction 41 after the first buffer layer 31 is partially removed. The active region 12 may be prevented from being exposed while the deep junction 41 is formed using the outer spacer 37.

Figure 17:
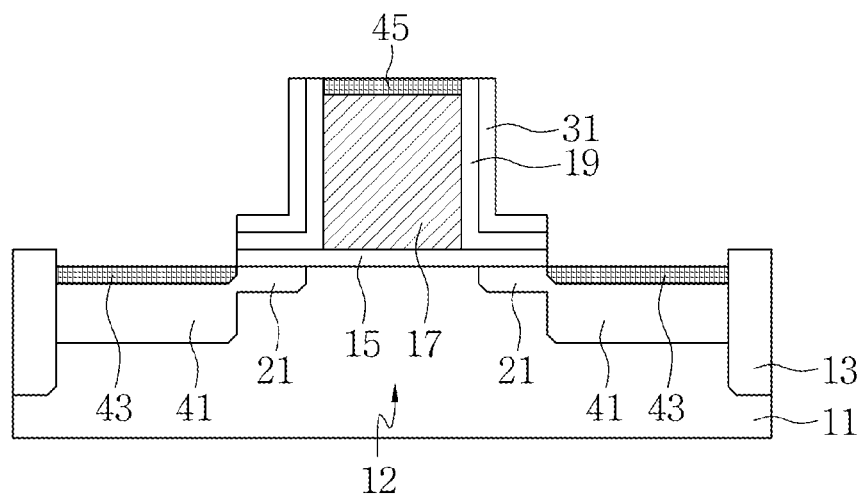

Referring to FIG. 17, the etch stop layer (35 shown in FIG. 15) and the second buffer layer (33 shown in FIG. 15) may be completely removed in example embodiments. The first buffer layer 31 and the inner spacer 19 may be preserved (or remain) on the side surfaces of the gate electrode 17.

Figure 18:
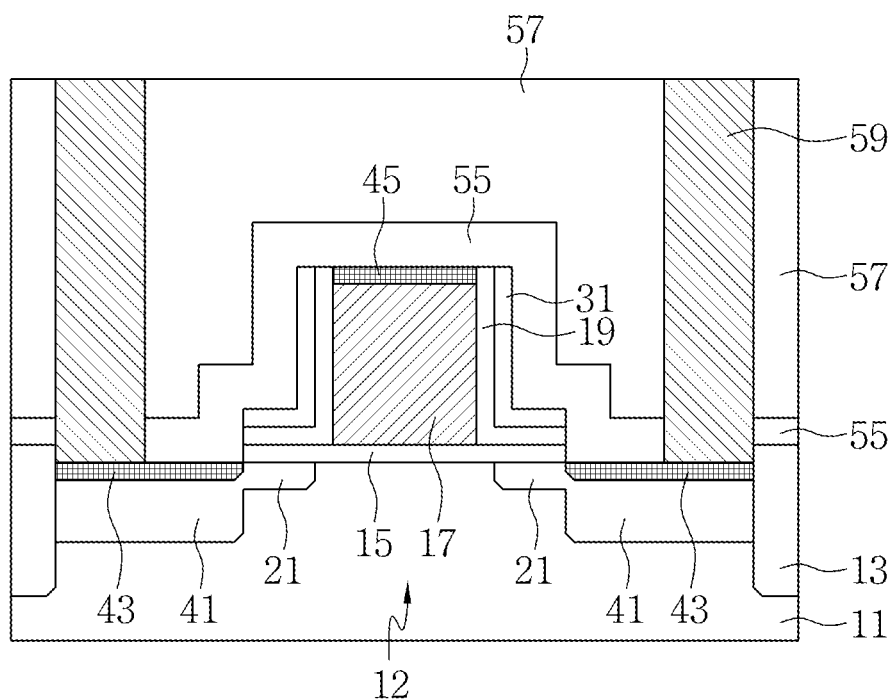

Referring to FIG. 18, the first buffer layer 31 may be in contact with the intermediate etch stop layer 55.

Figure 19:
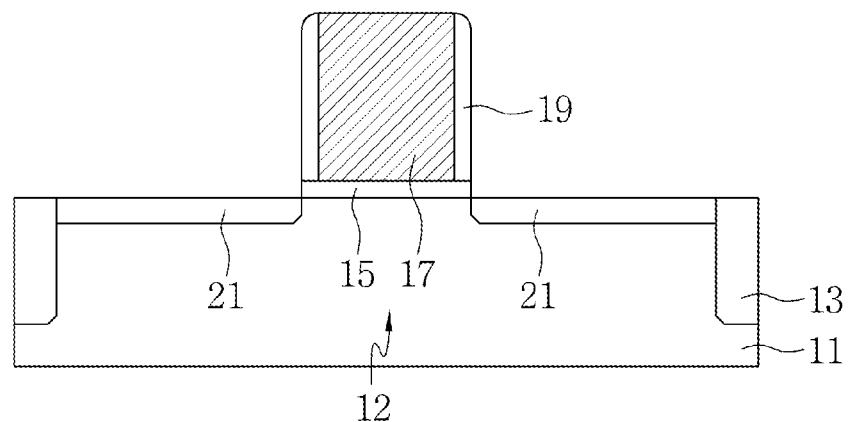

Referring to FIG. 19, an element isolation layer 13 may be formed to define (or, alternatively, delimit) an active region 12 on a substrate 11. A gate dielectric layer 15 may be formed on the active region 12. A gate electrode 17 may be formed on the gate dielectric layer 15. An inner spacer 19 may be formed to cover side surfaces of the gate electrode 17. A shallow junction 21 may be formed on the active region 12 near the gate electrode 17. The upper surfaces of the shallow junction 21 and the gate electrode 17 may be exposed. The gate dielectric layer 15 may be preserved (or remain) between the gate electrode 17 and the active region 12. The gate dielectric layer 15 may be preserved (or remain) between the inner spacer 19 and the active region 12.

Figure 20:
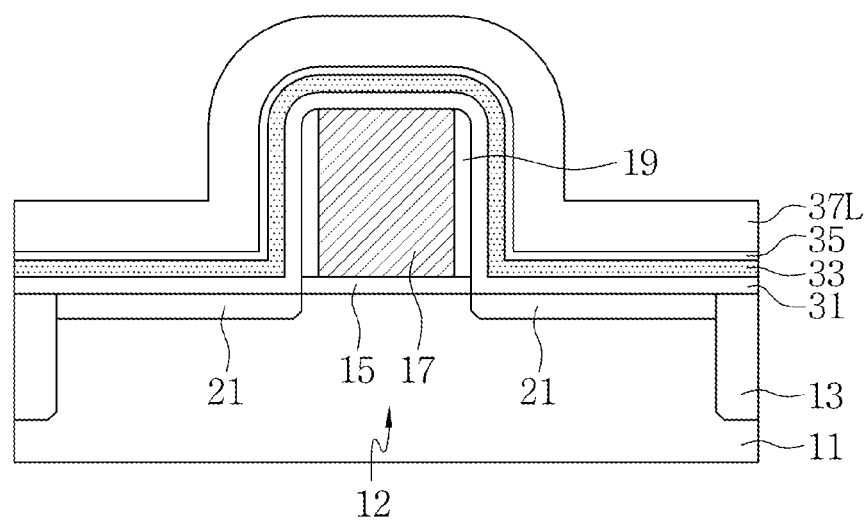

Referring to FIG. 20, a first buffer layer 31 may be formed on the inner spacer 19. The first buffer layer 31 may be in contact with the upper surface of the gate electrode 17 and the shallow junction 21. The second buffer layer 33, the etch stop layer 35 and the outer spacer layer 37L may sequentially be formed on the first buffer layer 31.

Figure 21:
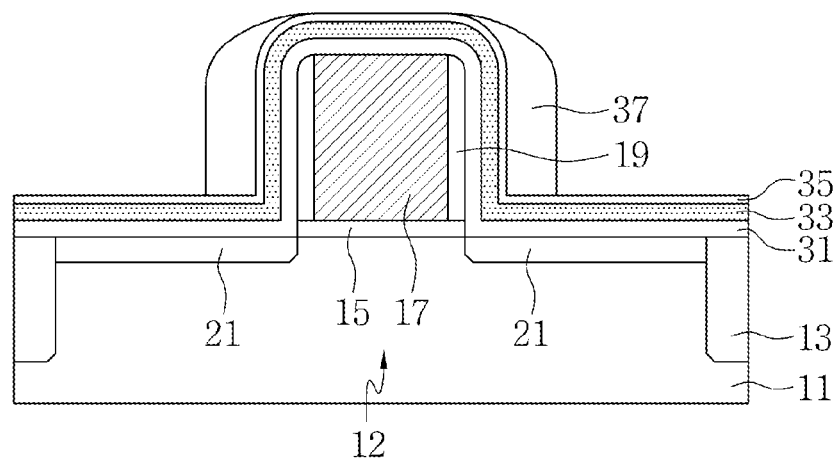

Referring to FIG. 21, an outer spacer 37 may be formed by anisotropically etching the outer spacer layer 37L until the etch stop layer 35 is exposed.

Figure 22:
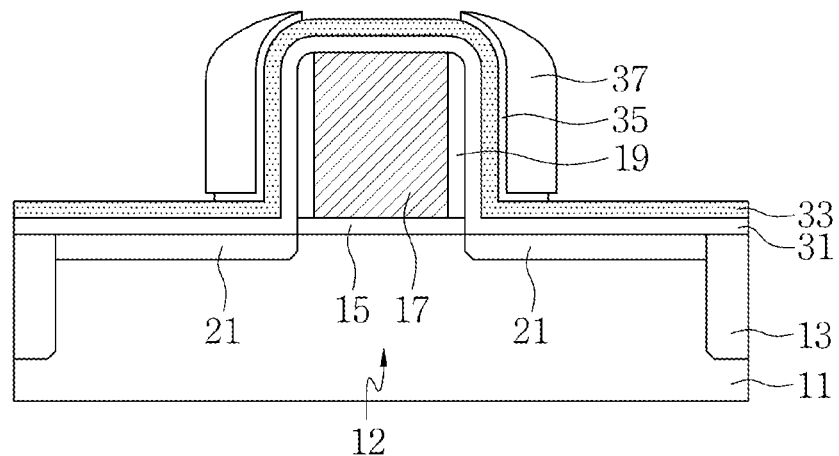

Referring to FIG. 22, the second buffer layer 33 may be exposed by partially removing the etch stop layer 35.

Figure 23:
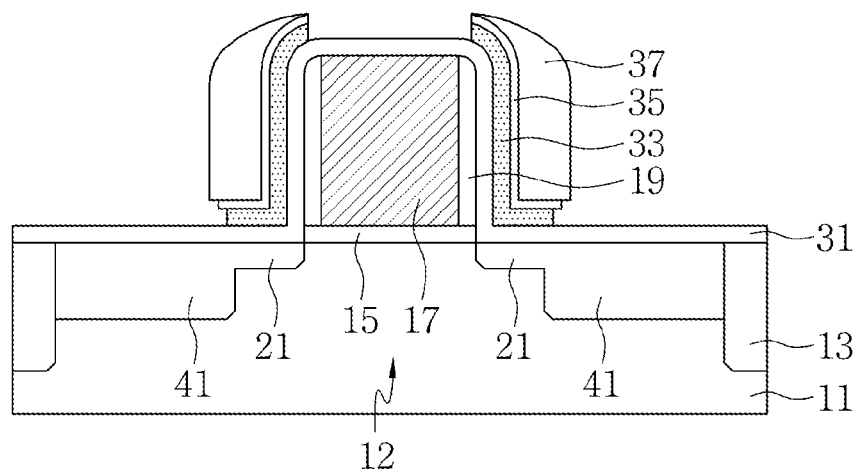

Referring to FIG. 23, the first buffer layer 31 may be exposed by partially removing the second buffer layer 33. The first buffer layer 31 may be exposed on an upper portion of the gate electrode 17. In addition, the first buffer layer 31 may be exposed on the shallow junction 21. The first buffer layer 31 may function to prevent the shallow junction 21 from being damaged while the second buffer layer 33 is removed. A deep junction 41 may be formed by ion implanting impurities into the active region 12 using the outer spacer 37 as an ion implantation mask. The first buffer layer 31 may be preserved (or remain) on the shallow junction 21 and the deep junction 41 while the deep junction 41 is formed.

Figure 24:
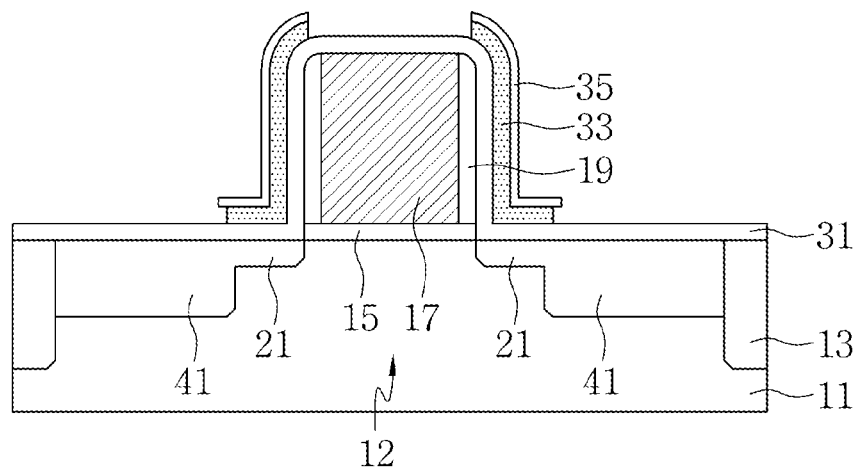

Referring to FIG. 24, the etch stop layer 35 may be exposed by removing the outer spacer 37. The first buffer layer 31 may be preserved (or remain) on the shallow junction 21 and the deep junction 41 while the outer spacer 37 is removed. The first buffer layer 31 may function to prevent the shallow junction 21 and the deep junction 41 from being damaged while the outer spacer 37 is removed.

Figure 25:
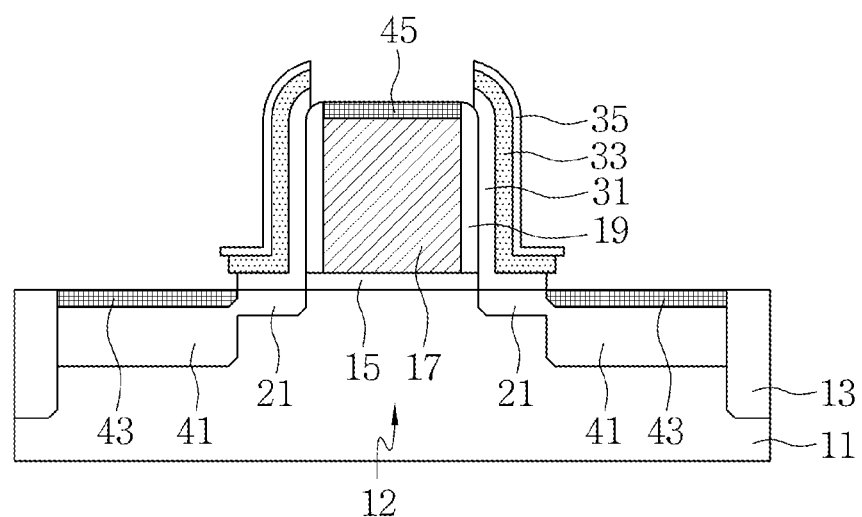

Referring to FIG. 25, upper surfaces of the gate electrode 17 and the deep junction 41 may be exposed by partially removing the first buffer layer 31. Metal silicide layers 43 and 45 may be formed on upper surfaces of the gate electrode 17 and the deep junction 41

Figure 26:
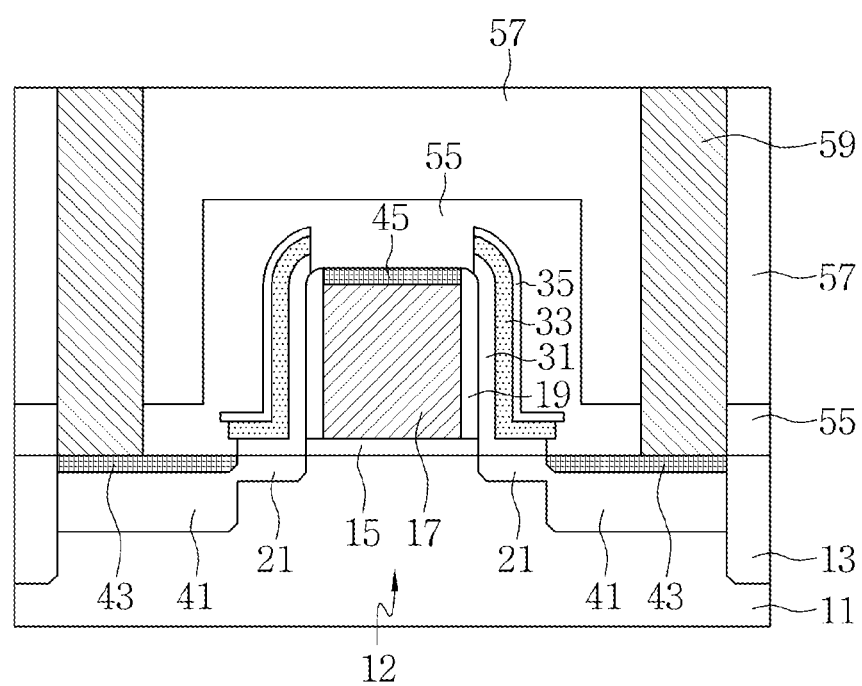

Referring to FIG. 26, an intermediate etch stop layer 55 and an interlayer insulating layer 57 may in turn (or sequentially) be formed on the substrate 11 having the metal silicide layers 43 and 45. A contact plug 59 may be formed which passes through the interlayer insulating layer 57 and the intermediate etch stop layer 55.

Figure 27:
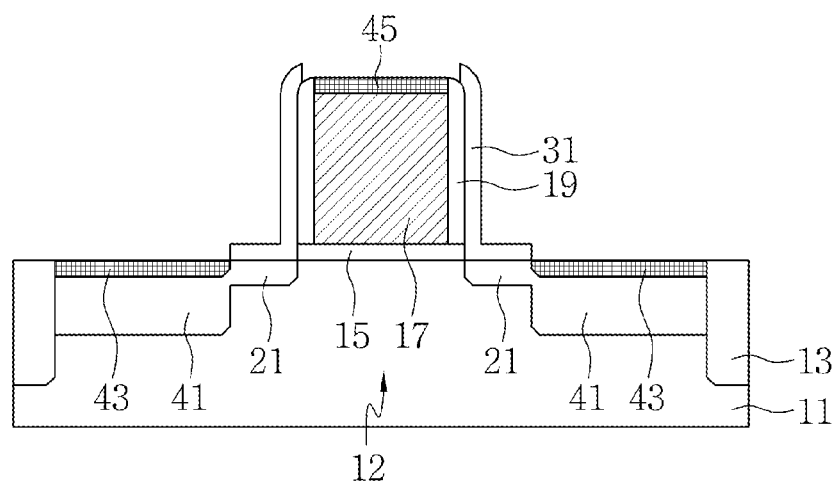

Referring to FIG. 27, the etch stop layer (35 shown in FIG. 25) and the second buffer layer (33 shown in FIG. 25) may be completely removed in example embodiments. The first buffer layer 31 and the inner spacer 19 may be preserved (or remain) on the side surfaces of the gate electrode 17.

Figure 28:
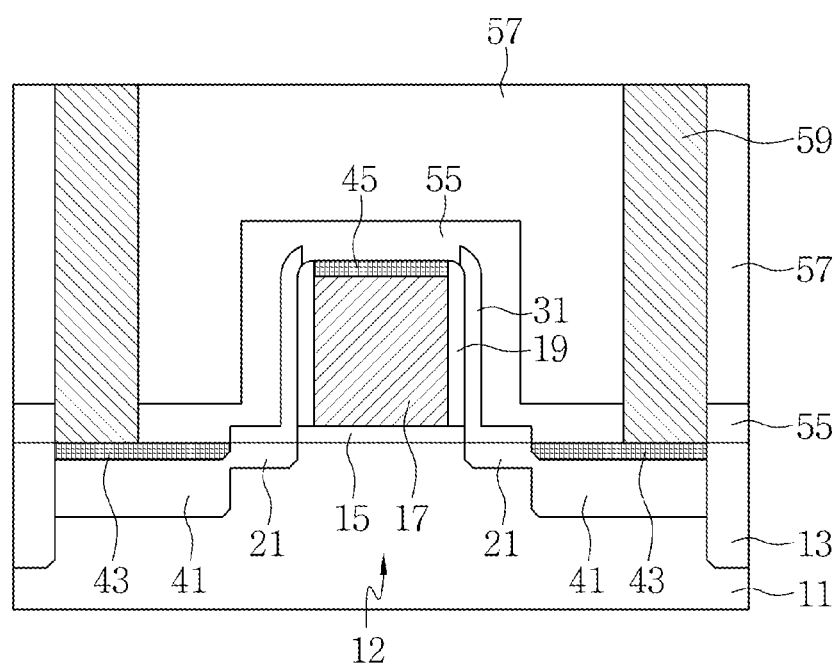

Referring to FIG. 28, the first buffer layer 31 may be in contact with the intermediate etch stop layer 55.

Figure 29:
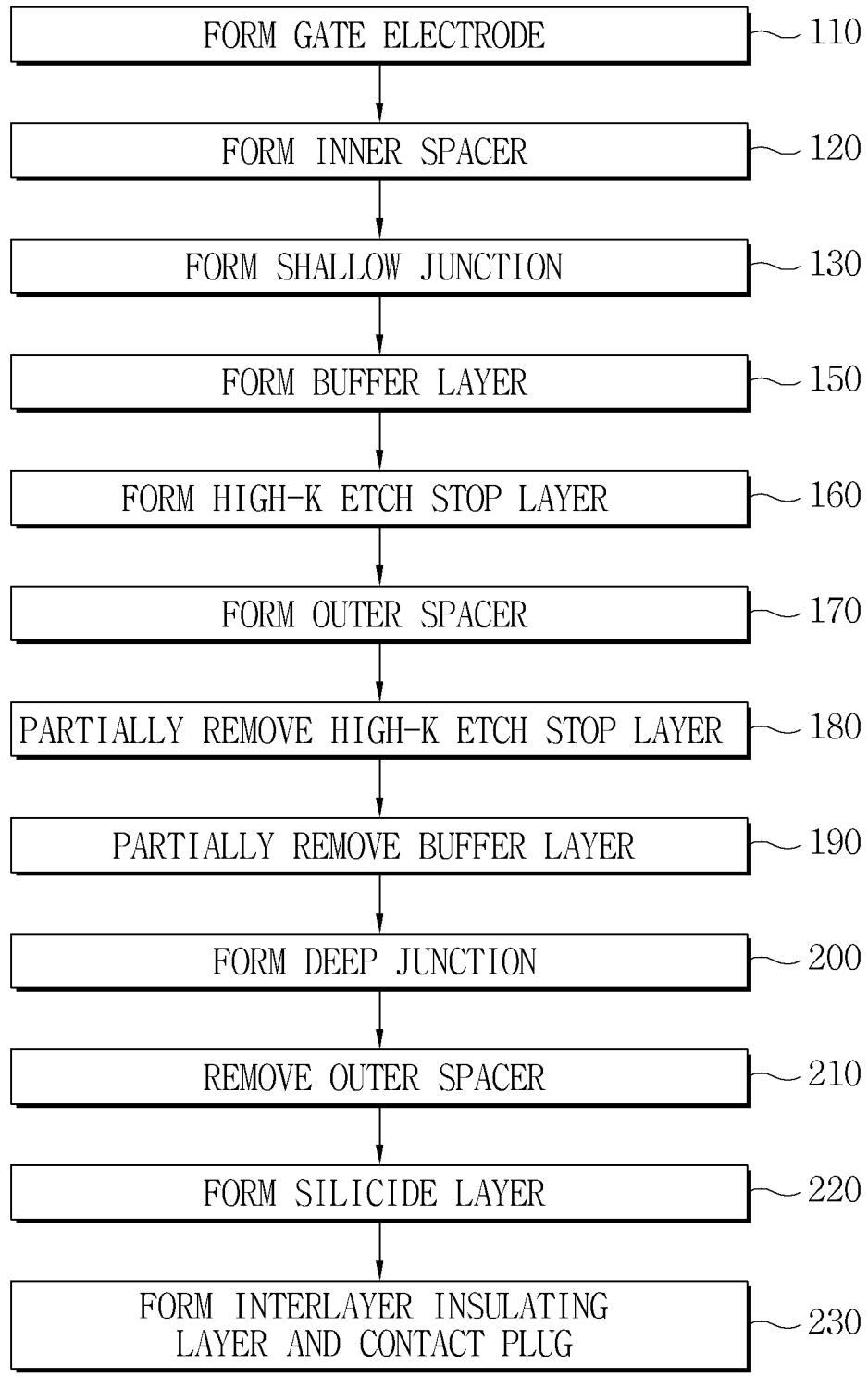

Referring to FIG. 29, a method of fabricating a semiconductor device in accordance with example embodiments may include forming a gate electrode (operation 110), forming an inner spacer (operation 120), forming a shallow junction (operation 130), forming a buffer layer (operation 150), forming an etch stop layer having a high-K material (operation 160), forming an outer spacer (operation 170), partially removing the etch stop layer (operation 180), partially removing the buffer layer (operation 190), forming a deep junction (operation 200), removing the outer spacer (operation 210), forming a metal silicide layer (operation 220), and forming an interlayer insulating layer and a contact plug (operation 230). Hereafter, example embodiments will be described in detail with reference to the drawings.

Figure 30:
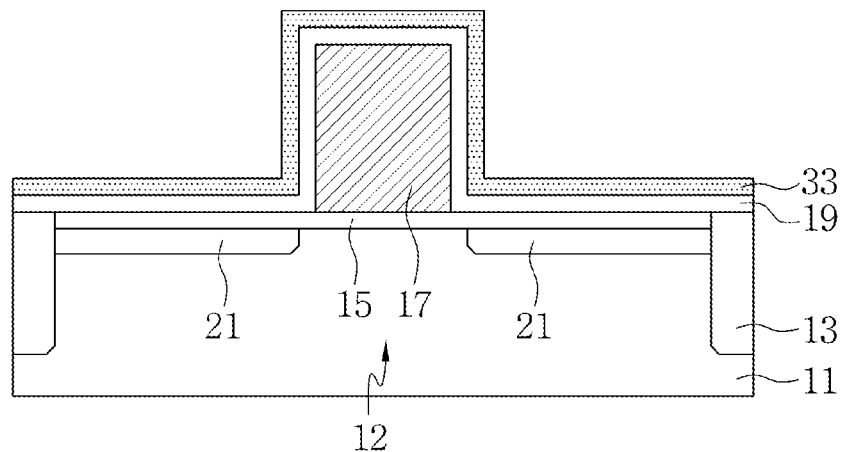

Referring to FIGS. 29 and 30, an element isolation layer 13 may be formed to define (or delimit) an active region 12 on a substrate 11. A gate dielectric layer 15 may be formed on the active region 12. A gate electrode 17 may be formed on the gate dielectric layer 15 (operation 110). An inner spacer 19 may be formed to cover side surfaces of the gate electrode 17 (operation 120). A shallow junction 21 may be formed by ion implanting impurities into the active region 12 near the gate electrode 17 using the inner spacer 19 as an ion implantation mask (operation 130). The buffer layer 33 may be formed on the inner spacer 19 (operation 150).

The buffer layer 33 may include a material layer having an etch selectivity with respect to the inner spacer 19. The first buffer layer 33 may include a different material from the inner spacer 19. For example, the inner spacer 19 may be silicon oxide, and the buffer layer 33 may be silicon nitride. The buffer layer 33 may be formed to have a thickness of about 5 nm to 15 nm. The buffer layer 33 may be formed to be thinner than the inner spacer 19. For example, the buffer layer 33 may be formed to have a thickness of about 7 nm. The buffer layer 33 may cover a side surface of the gate electrode 17 and the shallow junction 21. The buffer layer 33 may be L-shaped. The inner spacer 19 may be interposed between the buffer layer 33 and the gate dielectric layer 15.

Figure 31:
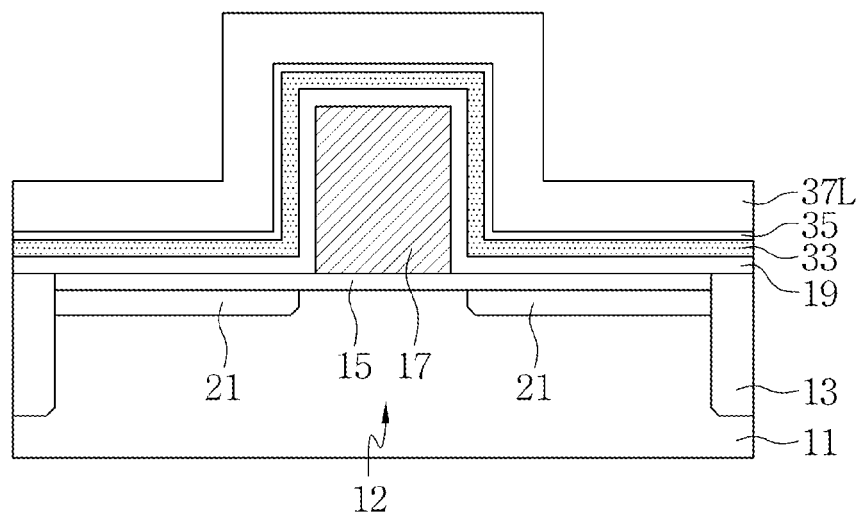

Referring to FIGS. 29 and 31, an etch stop layer 35 may be formed on the buffer layer 33 (operation 160). An outer spacer layer 37L may be formed on the etch stop layer 35.

Figure 32:
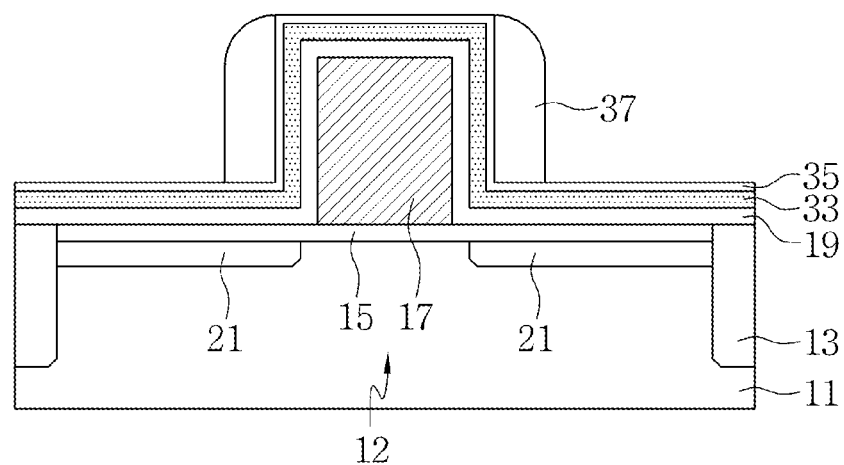

Referring to FIGS. 29 and 32, an outer spacer 37 may be formed by anisotropically etching the outer spacer layer 37L until the etch stop layer 35 is exposed (operation 170).

Figure 33:
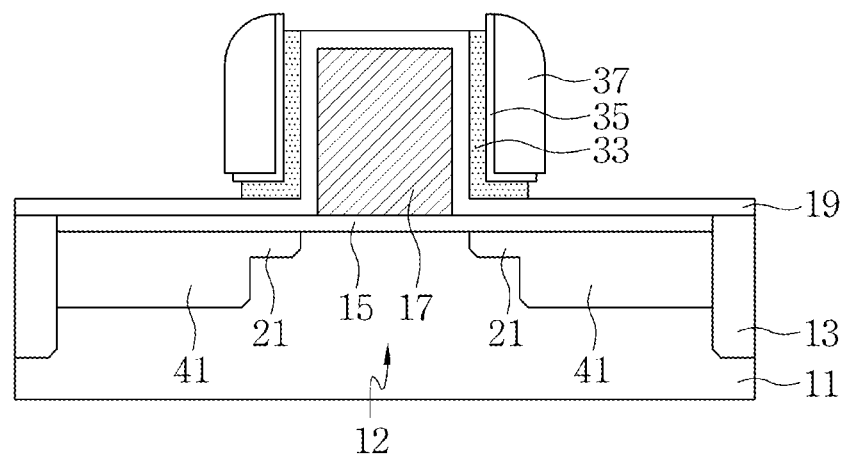

Referring to FIGS. 29 and 33, the buffer layer 33 may be exposed by partially removing the etch stop layer 35 (operation 180). The inner spacer 19 may be exposed by partially removing the buffer layer 33 (operation 190). A deep junction 41 may be formed by ion implanting impurities into the active region 12 using the outer spacer 37 as an ion implantation mask (operation 200).

Figure 34:
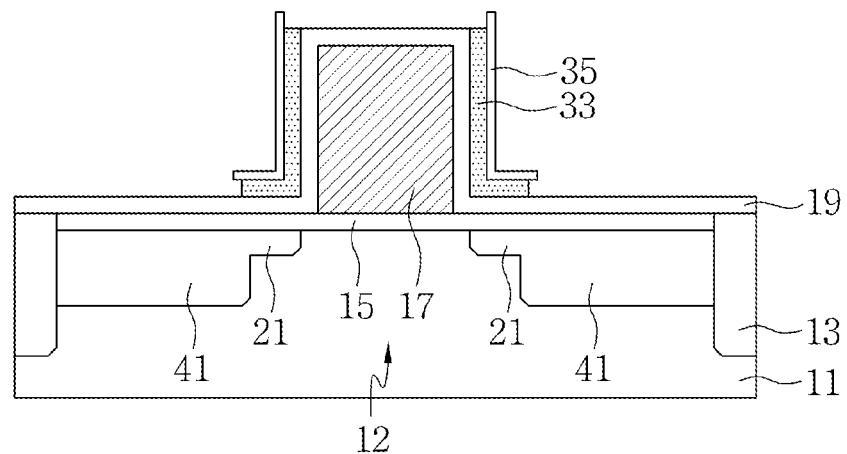

Referring to FIGS. 29 and 34, the etch stop layer 35 may be exposed by removing the outer spacer 37 (operation 210). The inner spacer 19 may be preserved (or remain) on the shallow junction 21 and the deep junction 41 while the outer spacer 37 is removed. The inner spacer 19 may function to prevent the shallow junction 21 and the deep junction 41 from being damaged while the outer spacer 37 is removed.

Figure 35:
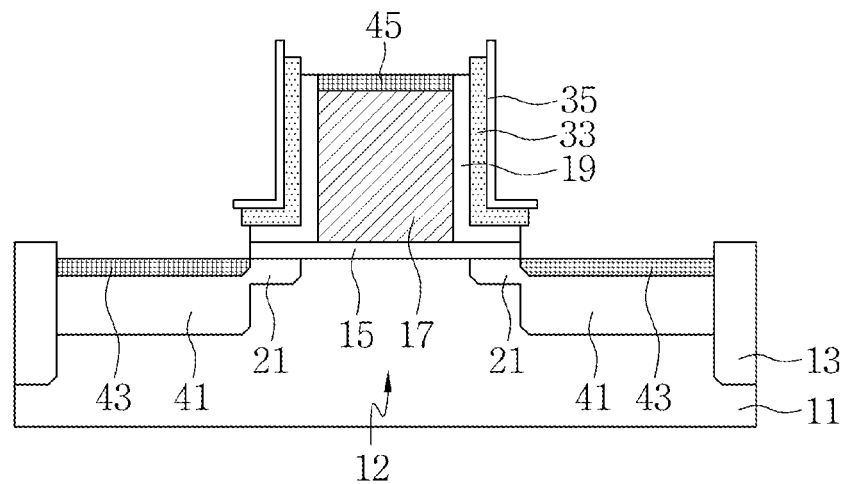

Referring to FIGS. 29 and 35, upper surfaces of the gate electrode 17 and the deep junction 41 may be exposed by partially removing the inner spacer 19 and the gate dielectric layer 15. Metal silicide layers 43 and 45 may be formed on upper surfaces of the gate electrode 17 and the deep junction 41 (operation 220).

Figure 36:
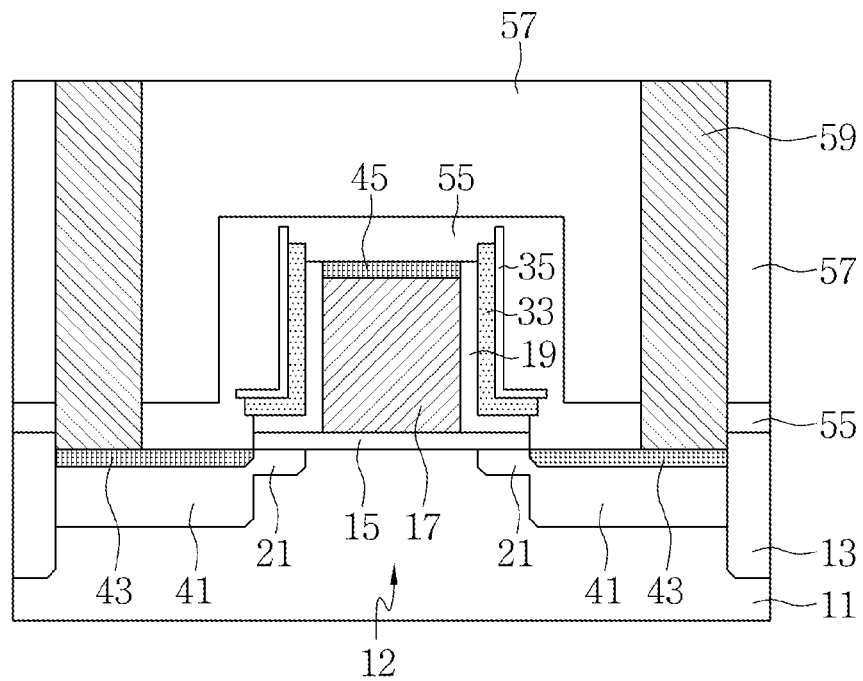

Referring to FIGS. 29 and 36, an intermediate etch stop layer 55 and an interlayer insulating layer 57 may in turn (or sequentially) be formed on the substrate 11 having the metal silicide layers 43 and 45. A contact plug 59 may be formed which passes through the interlayer insulating layer 57 and the intermediate etch stop layer 55 (operation 230).

Figure 37:
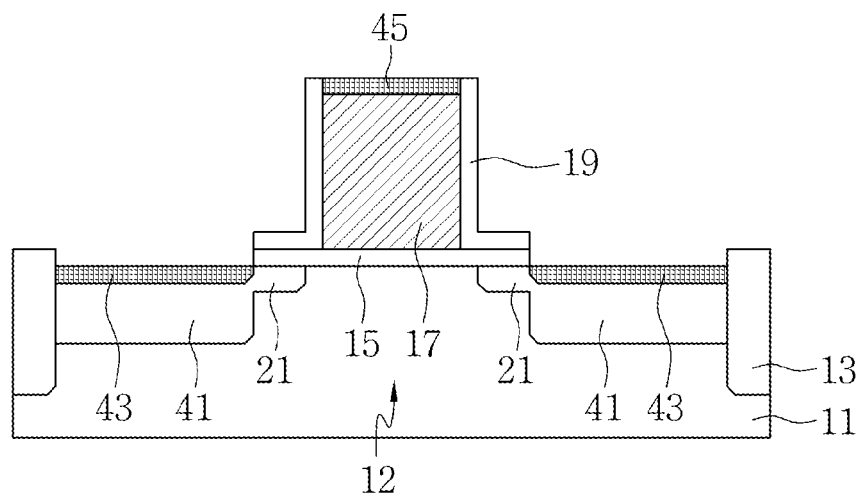

Referring to FIG. 37, the etch stop layer (35 shown in FIG. 35) and the buffer layer (33 shown in FIG. 35) may be completely removed in example embodiments. The inner spacer 19 may be preserved (or remain) on the side surfaces of the gate electrode 17.

Figure 38:
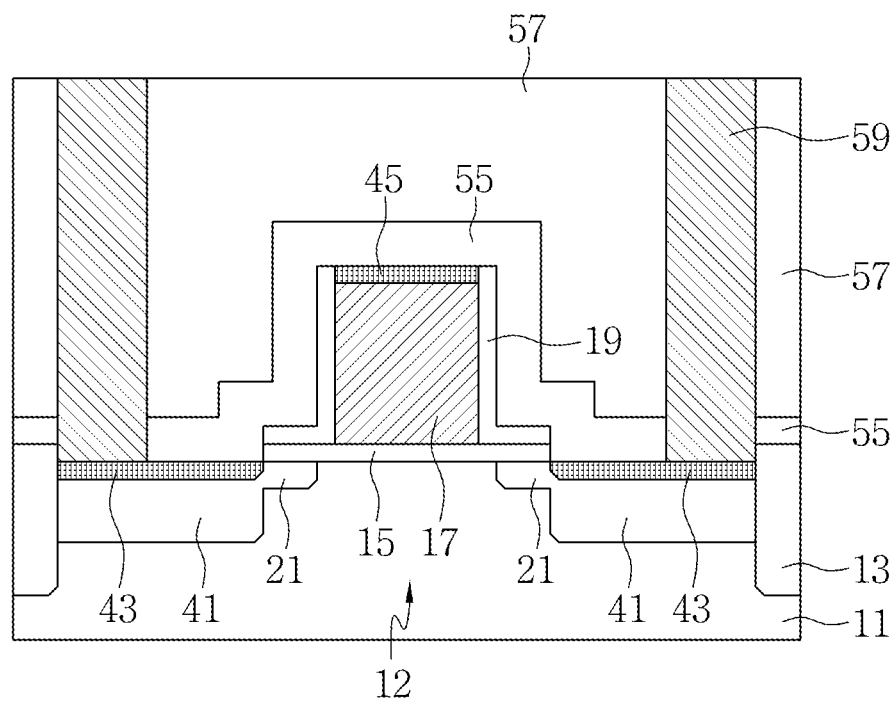

Referring to FIG. 38, the inner spacer 19 may be in contact with the intermediate etch stop layer 55.

Figure 39:
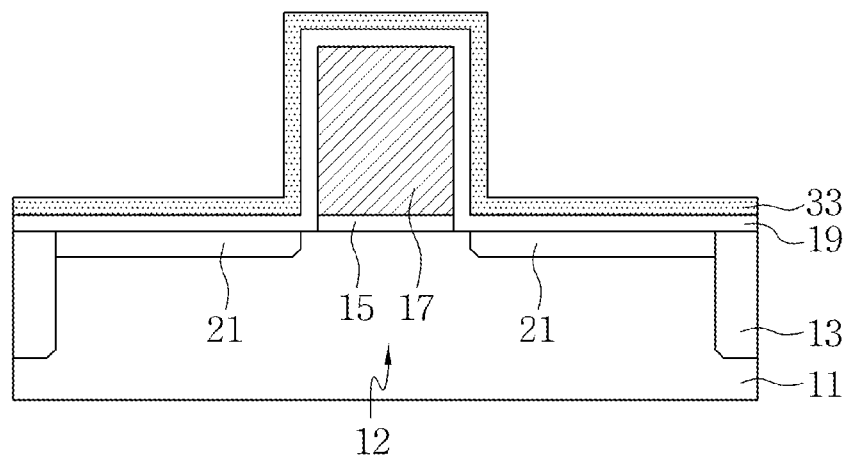

Referring to FIG. 39, an element isolation layer 13 may be formed to define (or delimit) an active region 12 on a substrate 11. A gate dielectric layer 15 may be formed on the active region 12. A gate electrode 17 may be formed on the gate dielectric layer 15. The gate dielectric layer 15 may be interposed between the gate electrode 17 and the active region 12. An inner spacer 19 may be formed to cover side surfaces of the gate electrode 17. The inner spacer 19 may cover the active region 12 near both sides of gate electrode 17. A shallow junction 21 may be formed by ion implanting impurities into the active region 12 near the gate electrode 17 using the inner spacer 19 as an ion implantation mask. A buffer layer 33 may be formed on the inner spacer 19.

Figure 40:
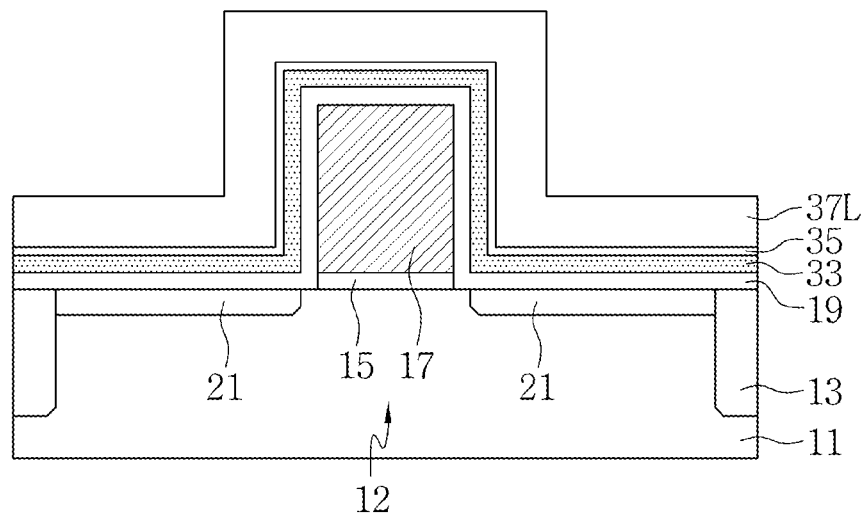

Referring to FIG. 40, an etch stop layer 35 may be formed on the buffer layer 33. An outer spacer layer 37L may be formed on the etch stop layer 35.

Figure 41:
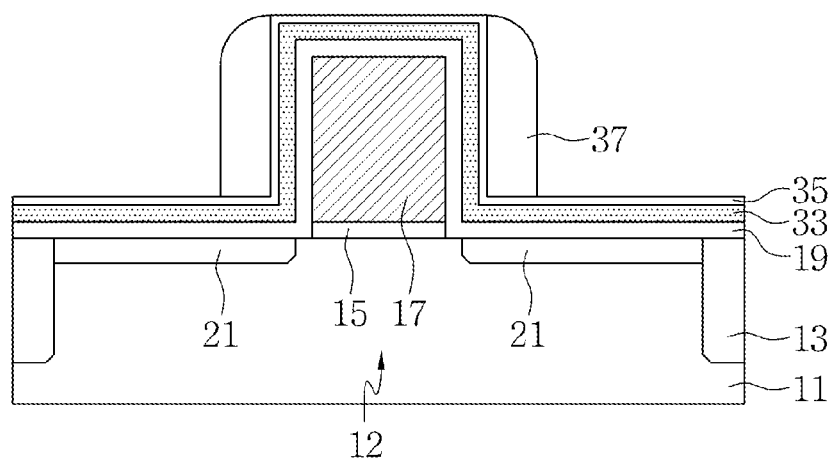

Referring to FIG. 41, an outer spacer 37 may be formed by anisotropically etching the outer spacer layer 37L until the etch stop layer 35 is exposed.

Figure 42:
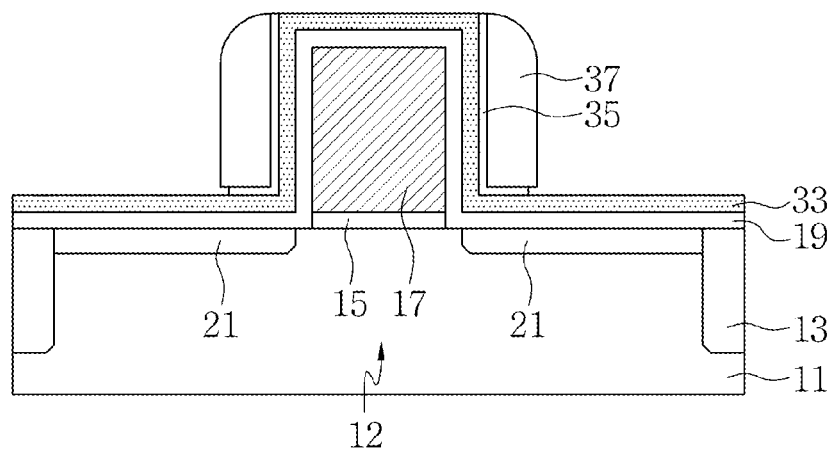

Referring to FIG. 42, the buffer layer 33 may be exposed by partially removing the etch stop layer 35.

Figure 43:
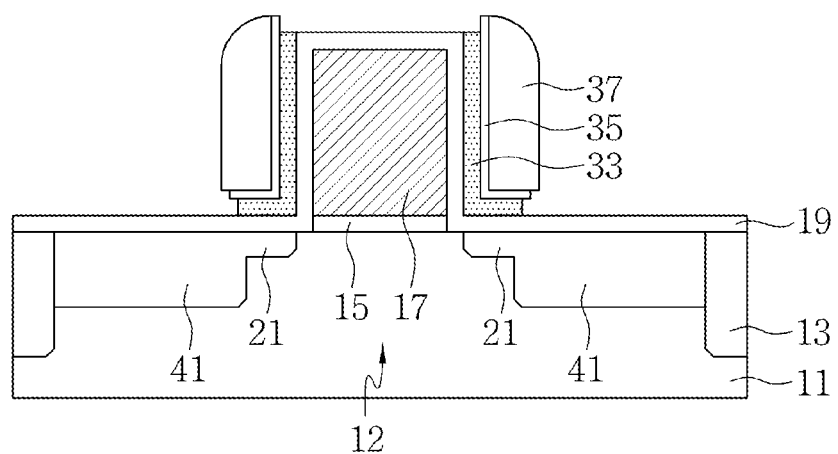

Referring to FIG. 43, the inner spacer 19 may be exposed by partially removing the buffer layer 33. A deep junction 41 may be formed by ion implanting impurities into the active region 12 using the outer spacer 37 as an ion implantation mask.

Figure 44:
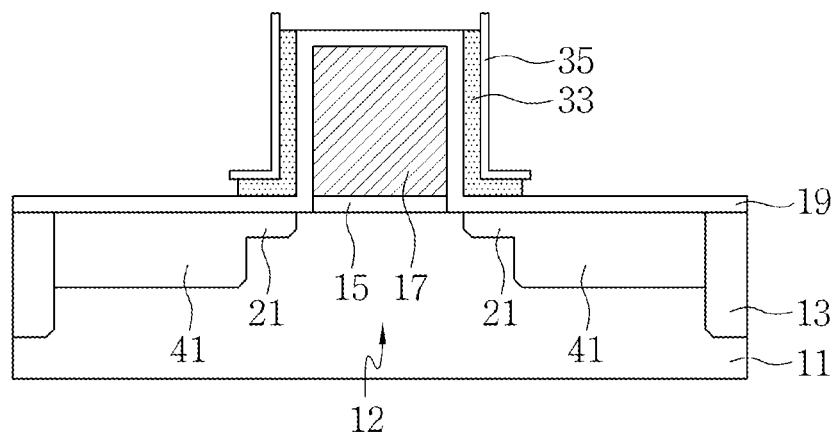

Referring to FIG. 44, the etch stop layer 35 may be exposed by removing the outer spacer 37.

Figure 45:
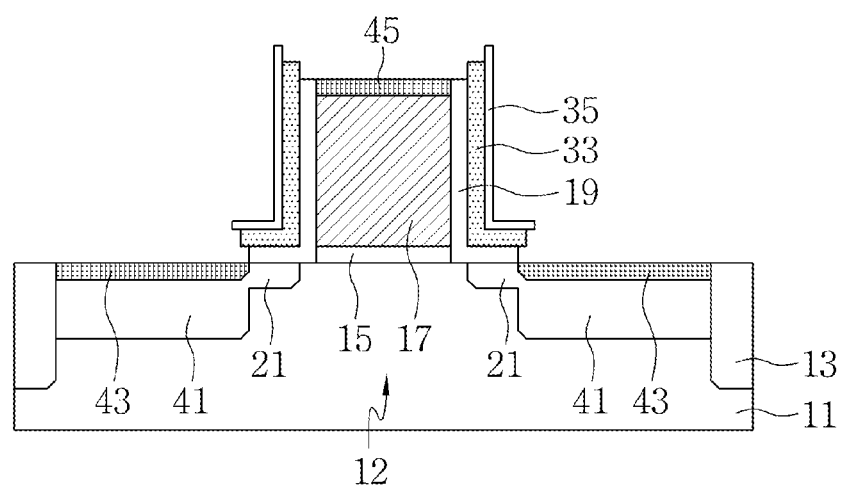

Referring to FIG. 45, upper surfaces of the gate electrode 17 and the deep junction 41 may be exposed by partially removing the inner spacer 19. Metal silicide layers 43 and 45 may be formed on the upper surfaces of the gate electrode 17 and the deep junction 41.

Figure 46:
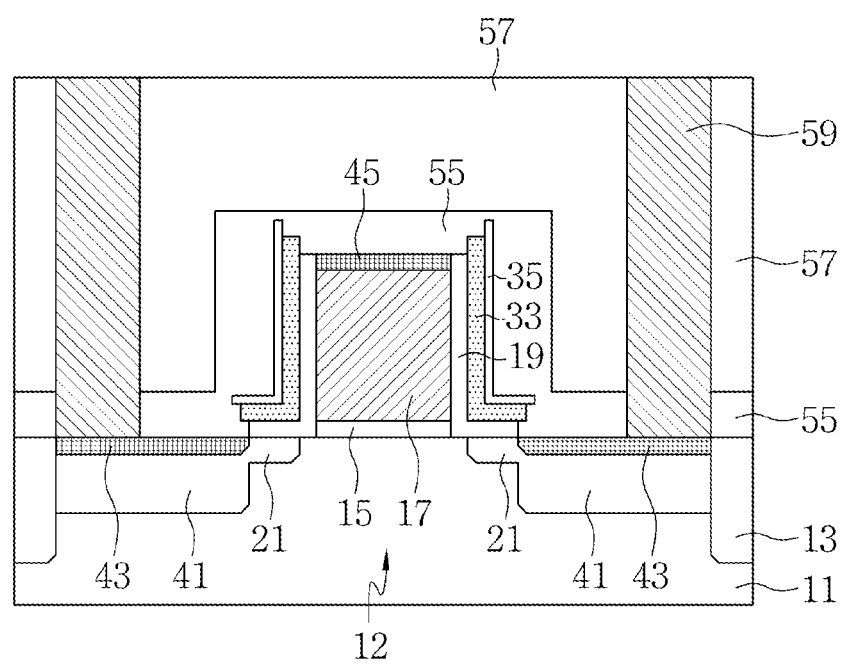

Referring to FIG. 46, an intermediate etch stop layer 55 and an interlayer insulating layer 57 may sequentially be formed on the substrate 11 having the metal silicide layers 43 and 45.

A contact plug 59 may be formed which passes through the interlayer insulating layer 57 and the intermediate etch stop layer 55.

Figure 47:
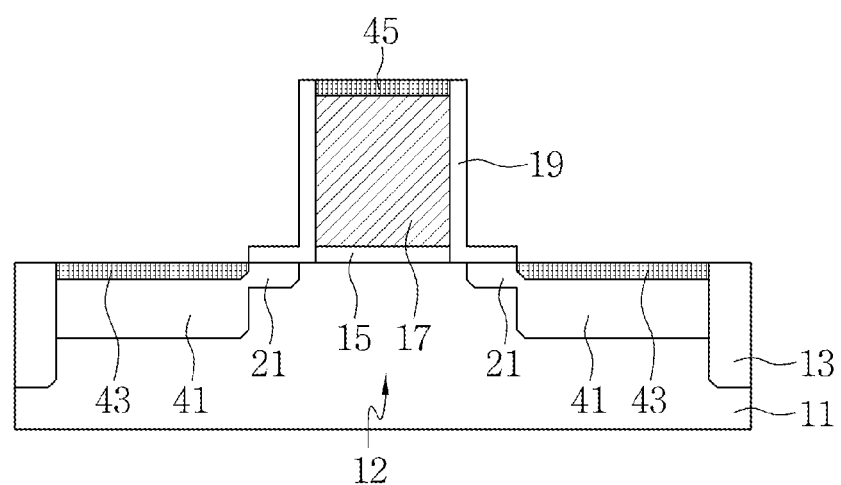

Referring to FIG. 47, the etch stop layer (45 shown in FIG. 35) and the buffer layer (33 shown in FIG. 45) may be completely removed in example embodiments. The inner spacer 19 may be preserved (or remain) on the side surfaces of the gate electrode 17.

Figure 48:
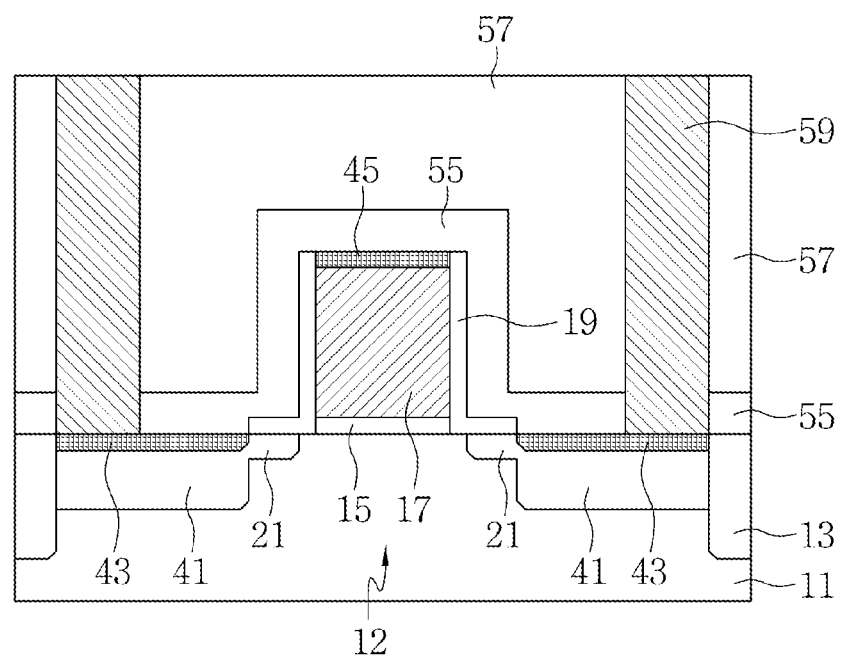

Referring to FIG. 48, the inner spacer 19 may be in contact with the intermediate etch stop layer 55.

Figure 49:
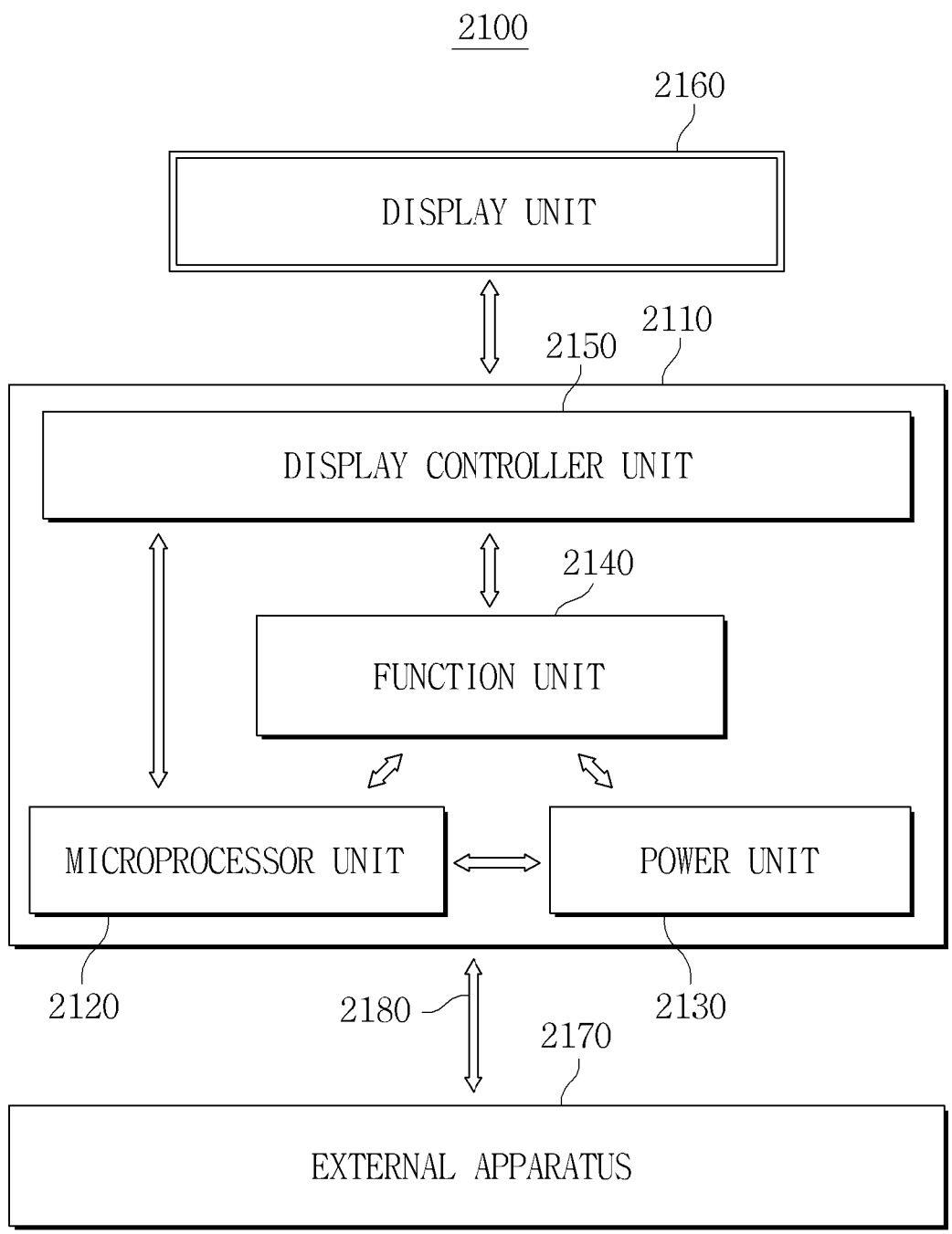

FIG. 49 is a block diagram illustrating a system for explaining an electronic device in accordance with application of example embodiments.

Referring to FIG. 49, a semiconductor device similar to that described with reference to FIGS. 1 to 48 may be applied to an electric system 2100. The electric system 2100 may include a body 2110, a microprocessor unit 2120, a power unit 2130, a function unit 2140, and a display controller unit 2150. The body 2100 may be a mother board formed by a printed circuit board (PCB). The microprocessor unit 2120, the power unit 2130, the function unit 2140, and the display controller unit 2150 may be mounted on the body 2110. The display unit 2160 may be disposed inside or outside the body 2100. For example, the display unit 2160 may be disposed on a surface of the body 2110 to display images processed by the display controller unit 2150 to a user.

The power unit 2130 may function to receive a constant voltage from an external battery (not shown) and divide the received voltage into required voltages levels to supply the divided voltages to the microprocessor unit 2120, the function unit 2140, the display controller unit 2150, etc. The microprocessor unit 2120 may receive a voltage from the power unit 2130 to then control the function unit 2140 and the display controller unit 2160. The function unit 2140 may perform various functions of the electronic system 2100. For example, in a case where the electronic system 2100 is a portable phone, the function unit 2140 may include various components, which can perform portable functions such as dialing, outputting video to the display unit 2160 and outputting audio to a speaker, in communication with an external apparatus 2170, and the like, and functions as a camera image processor when a camera is mounted together.

In an application of example embodiments, in a case where the electronic system 2100 is connected with a memory card or the like in order to expand capacity, the function unit 2140 may be a memory card controller. The function unit 2140 may transmit/receive signals to/from the external apparatus 2170 through a wired or wireless communication unit 2180. Further, in a case where the electronic system 2100 needs a universal serial bus (USB) in order to expand function, the function unit 2140 may function as an interface controller. Furthermore, the function unit 2140 may include a mass storage device.

The semiconductor device similar to that described with reference to FIGS. 1 to 48 may be applied to the function unit 2140 or the microprocessor unit 2120. For example, the function unit 2140 may include the deep junction 41 and metal silicide layers 43 and 45. In this case, the function unit 2140 may exhibit superior electrical properties compared to the related art due to the configuration of the deep junction 41 and metal silicide layers 43 and 45. Accordingly, the electrical properties of the electronic system 2100 may be improved, compared to the related art.

Figure 50:
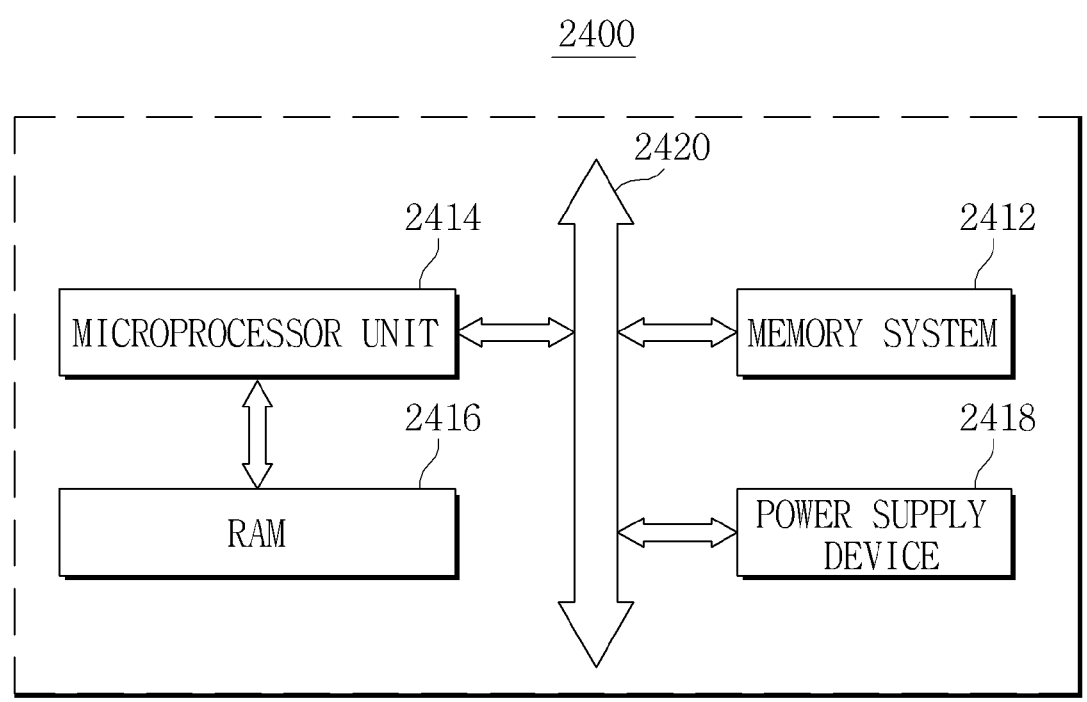

FIG. 50 is a block diagram schematically illustrating another electronic system 2400 including at least one of semiconductor devices in accordance with application example embodiments.

Referring to FIG. 50, the electronic system 2400 may include at least one of semiconductor devices in accordance with example embodiments. The electronic system 2400 may be used to manufacture a mobile device or computer. For example, the electronic system 2400 may include a memory system 2412, a microprocessor unit 2414, a RAM 2416 and a power supply device 2418. The microprocessor unit 2414 may program and control the electronic system 2400. The RAM 2416 may be used as an operation memory of the microprocessor unit 2414. The microprocessor unit 2414, the RAM 2416 and/or other configuration elements may be assembled into a single package. The memory system 2412 may store codes for operation of the microprocessor unit 2414, data processed by the microprocessor unit 2414, or external input data. The memory system 2412 may include a controller and a memory.

The semiconductor device similar to that described with reference to FIGS. 1 to 48 may be applied to the microprocessor unit 2414, the RAM 2416, or the memory system 2412. For example, the microprocessor unit 2414 may include the deep junction 41 and metal silicide layers 43 and 45. In this case, the microprocessor unit 2414 may exhibit superior electrical properties compared to the related art due to the configuration of the deep junction 41 and metal silicide layers 43 and 45. Accordingly, the electrical properties of the electronic system 2400 may be improved, compared to the related art.

In accordance with example embodiments, an outer spacer, a first buffer layer, the second buffer layer and the etch stop layer may be material layers different from one another. The etch stop layer may be an insulating layer including metal elements. The etch stop layer may exhibit a very high etch selectivity in a process of forming the outer spacer. The surface of the semiconductor substrate may be protected while the outer spacer is formed. Exposure of the semiconductor substrate may be prevented by using the outer spacer while a deep junction is formed. Therefore, in accordance with example embodiments, a semiconductor device can be implemented which is favorable to highly integrate and has excellent electrical properties.

The foregoing is illustrative of example embodiments and is not to be construed as limiting thereof. Although a few example embodiments have been described, those skilled in the art will readily appreciate that many modifications are possible in embodiments without materially departing from the novel teachings and advantages. Accordingly, all such modifications are intended to be included within the scope as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific example embodiments disclosed, and that modifications to the disclosed embodiments, as well as other example embodiments, are intended to be included within the scope of the appended claims.

What is claimed is:

1. A method of fabricating a semiconductor device, comprising:

forming a gate electrode on a substrate;

sequentially forming a first buffer layer, a second buffer layer and a third buffer layer on side surfaces of the gate electrode and on the substrate near the gate electrode, the third buffer layer being a material layer having a higher dielectric constant than the second buffer layer;

forming a first spacer covering the side surfaces of the gate electrode on the third buffer layer, the third buffer layer on the substrate near the gate electrode being exposed;
exposing the second buffer layer on the substrate by removing the exposed third buffer layer;
exposing the first buffer layer on the substrate by removing the exposed second buffer layer;
forming a deep junction in the substrate using the first spacer as an ion implantation mask; and
removing the first spacer,
wherein the first buffer layer remains over the deep junction when removing the first spacer, and
the first spacer includes a material layer different than the third buffer layer, the second buffer layer, and the first buffer layer.

2. The method according to claim 1, wherein the third buffer layer is an insulating layer including a metal.

3. The method according to claim 1, wherein the first buffer layer includes silicon oxide, the second buffer layer includes silicon nitride, and the first spacer includes one selected from poly-silicon, amorphous silicon and a combination thereof.

4. The method according to claim 1, wherein the second buffer layer includes a material layer different than the third buffer layer, and
the third buffer layer is thinner than the second buffer layer.

5. The method according to claim 1, wherein the forming of the third buffer layer includes,
forming the second buffer layer over the first buffer layer; and
doping metal elements in a surface of the second buffer layer.

6. The method according to claim 1, wherein the removing of the exposed third buffer layer includes performing an isotropic etch process, and
the second buffer layer remains over the first buffer layer when removing the exposed third buffer layer.

7. The method according to claim 6, further comprising:
forming an under-cut region between the first spacer and the second buffer layer.

8. The method according to claim 1, wherein the removing of the exposed second buffer layer includes performing an isotropic etch process,
the first buffer layer remains over the substrate near the gate electrode when removing the exposed second buffer layer, and
the second buffer layer is a material layer different than the first buffer layer.

9. The method according to claim 8, further comprising:
forming an under-cut region between the first spacer and the first buffer layer.

10. The method according to claim 1, wherein the forming of the first spacer includes,
forming a first spacer layer on the third buffer layer; and
anisotropically etching the first spacer layer until the third buffer layer is exposed, the first spacer layer being about 3 to 10 times thicker than the third buffer layer.

11. The method according to claim 1, further comprising:
exposing the substrate by removing the exposed first buffer layer, after the removing of the first spacer; and
forming a metal silicide layer on the deep junction.

12. The method according to claim 1, further comprising:
forming a second spacer on the side surfaces of the gate electrode, prior to the forming of the first buffer layer; and
forming a shallow junction in the substrate near the gate electrode.

13. The method according to claim 12, wherein the second spacer is expanded between the first buffer layer and the substrate.

14. The method according to claim 12, wherein the second spacer includes a material layer that is the same as the first buffer layer.

15. A method of fabricating a semiconductor device, comprising:
forming a gate electrode on a substrate;
forming an inner spacer covering side surfaces of the gate electrode and the substrate;
forming a shallow junction in the substrate near the gate electrode;
sequentially forming a buffer layer and an etch stop layer on the inner spacer, the etch stop layer being an insulating layer having a plurality of metal elements;
forming an outer spacer covering the side surfaces of the gate electrode on the etch stop layer, the etch stop layer being exposed on the shallow junction;
exposing the buffer layer on the shallow junction by removing the exposed etch stop layer;
exposing the inner spacer on the shallow junction by removing the exposed buffer layer;
forming a deep junction in the substrate using the outer spacer as an ion implantation mask;
removing the outer spacer;
exposing the substrate by removing the exposed inner spacer; and
forming a metal silicide layer on the deep junction,
wherein the outer spacer includes a material layer different than the etch stop layer, the buffer layer and the inner spacer.

16. A method of fabricating a semiconductor device, comprising:
forming a gate electrode on a substrate;
forming a buffering layer structure along exposed surfaces of the gate electrode, wherein the buffering layer structure includes at least two buffer layers of which an outermost buffer layer has a dielectric constant higher than at least one inner buffer layer;
forming a first spacer along side surfaces of the gate electrode and partially exposing the outermost buffer layer, wherein the first spacer includes a material layer different than that of the at least two buffer layers;
repeatedly exposing the buffering layer structure to sequentially pattern the at least two buffer layers;
forming a deep junction in the substrate using the first spacer as an ion implantation mask; and
removing the first spacer.

17. The method of claim 16, wherein side surfaces of the deep junction are spaced apart from the side surfaces of the gate electrode by a distance equal to a width of a patterned innermost buffer layer.

18. The method of claim 16, further comprising:
forming a second spacer covering the side surfaces of the gate electrode and the substrate, wherein the second spacer includes a material layer different than the material layer of the first spacer; and
forming a shallow junction in the substrate, prior to the forming of the buffering layer structure, wherein the shallow junction corresponds to the gate electrode.

19. The method of claim 18, wherein the repeatedly exposing of the buffering layer structure includes,
exposing the at least one inner buffer layer over the shallow junction by removing the exposed outermost buffer layer; and exposing the second spacer over the shallow junction by removing the exposed at least one inner buffer layer.

20. The method of claim 16, wherein an innermost buffer layer of the at least two buffer layers remains over the deep junction when removing the first spacer.

\* \* \* \* \*